(12) United States Patent
Chen et al.

(10) Patent No.: US 11,742,297 B2
(45) Date of Patent: *Aug. 29, 2023

(54) SEMICONDUCTOR PACKAGES

(71) Applicant: Taiwan Semiconductor Manufacturing Company, Ltd., Hsinchu (TW)

(72) Inventors: Ming-Fa Chen, Taichung (TW); Nien-Fang Wu, Chiayi (TW); Sung-Feng Yeh, Taipei (TW); Tzuan-Horng Liu, Taoyuan (TW); Chao-Wen Shih, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 152 days.

This patent is subject to a terminal disclaimer.

(21) Appl. No.: 17/338,676

(22) Filed: Jun. 4, 2021

(65) Prior Publication Data

US 2021/0296251 A1  Sep. 23, 2021

Related U.S. Application Data

(63) Continuation of application No. 16/658,131, filed on Oct. 20, 2019, now Pat. No. 11,056,438.

(Continued)

(51) Int. Cl.
*H01L 23/538* (2006.01)
*H01L 23/00* (2006.01)
(Continued)

(52) U.S. Cl.
CPC ...... *H01L 23/5389* (2013.01); *H01L 21/4853* (2013.01); *H01L 21/4857* (2013.01);
(Continued)

(58) Field of Classification Search
CPC ............ H01L 23/5389; H01L 21/4853; H01L 21/4857; H01L 21/565; H01L 23/3128; H01L 23/5383; H01L 23/5386; H01L 24/19; H01L 24/20; H01L 25/0652; H01L 25/0655; H01L 25/0657; H01L 25/50; H01L 2224/214; H01L 2225/06524; H01L 2225/06548; H01L 2225/06562; H01L 2225/06586; H01L 2924/19041;
(Continued)

(56) References Cited

U.S. PATENT DOCUMENTS 8,993,380 B2  3/2015  Hou et al.
9,281,254 B2  3/2016  Yu et al.
(Continued)

*Primary Examiner* — Tong-Ho Kim
(74) *Attorney, Agent, or Firm* — JCIPRNET

(57) ABSTRACT

A semiconductor package includes a first die, a plurality of second dies and a through via. The second dies are disposed over and electrically connected to the first die. The through via is disposed between the second dies and electrically connected to the first die. The through via includes a first portion having a first width and a second portion having a second width different from the first width and disposed between the first portion and the first die. The first portion includes a first seed layer and a first conductive layer, and the first seed layer is disposed aside an interface between the first portion and the second portion.

20 Claims, 29 Drawing Sheets

Related U.S. Application Data

(60) Provisional application No. 62/867,855, filed on Jun. 27, 2019.

(51) Int. Cl.
*H01L 25/065* (2023.01)
*H01L 21/48* (2006.01)
*H01L 21/56* (2006.01)
*H01L 25/00* (2006.01)
*H01L 23/31* (2006.01)

(52) U.S. Cl.
CPC ........ *H01L 21/565* (2013.01); *H01L 23/3128* (2013.01); *H01L 23/5383* (2013.01); *H01L 23/5386* (2013.01); *H01L 24/19* (2013.01); *H01L 24/20* (2013.01); *H01L 25/0652* (2013.01); *H01L 25/0655* (2013.01); *H01L 25/0657* (2013.01); *H01L 25/50* (2013.01); *H01L 2224/214* (2013.01); *H01L 2225/06524* (2013.01); *H01L 2225/06548* (2013.01); *H01L 2225/06562* (2013.01); *H01L 2225/06586* (2013.01); *H01L 2924/19041* (2013.01); *H01L 2924/19105* (2013.01)

(58) Field of Classification Search
CPC ... H01L 2924/19105; H01L 2224/0557; H01L 2224/06181; H01L 2224/08145; H01L 2224/92244; H01L 2224/94; H01L 2225/06541; H01L 21/486; H01L 23/49816; H01L 23/5384; H01L 2224/04105; H01L 2224/12105; H01L 2224/32225; H01L 2224/73267; H01L 2224/97; H01L 2224/32145
USPC ........................................... 257/668
See application file for complete search history.

(56) References Cited

U.S. PATENT DOCUMENTS

| | | |
|---|---|---|
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,666,502 B2 | 5/2017 | Chen et al. |
| 9,735,131 B2 | 8/2017 | Su et al. |
| 11,056,438 B2 * | 7/2021 | Chen .................. H01L 25/0652 |
| 2017/0133351 A1 * | 5/2017 | Su ...................... H01L 23/5389 |

* cited by examiner

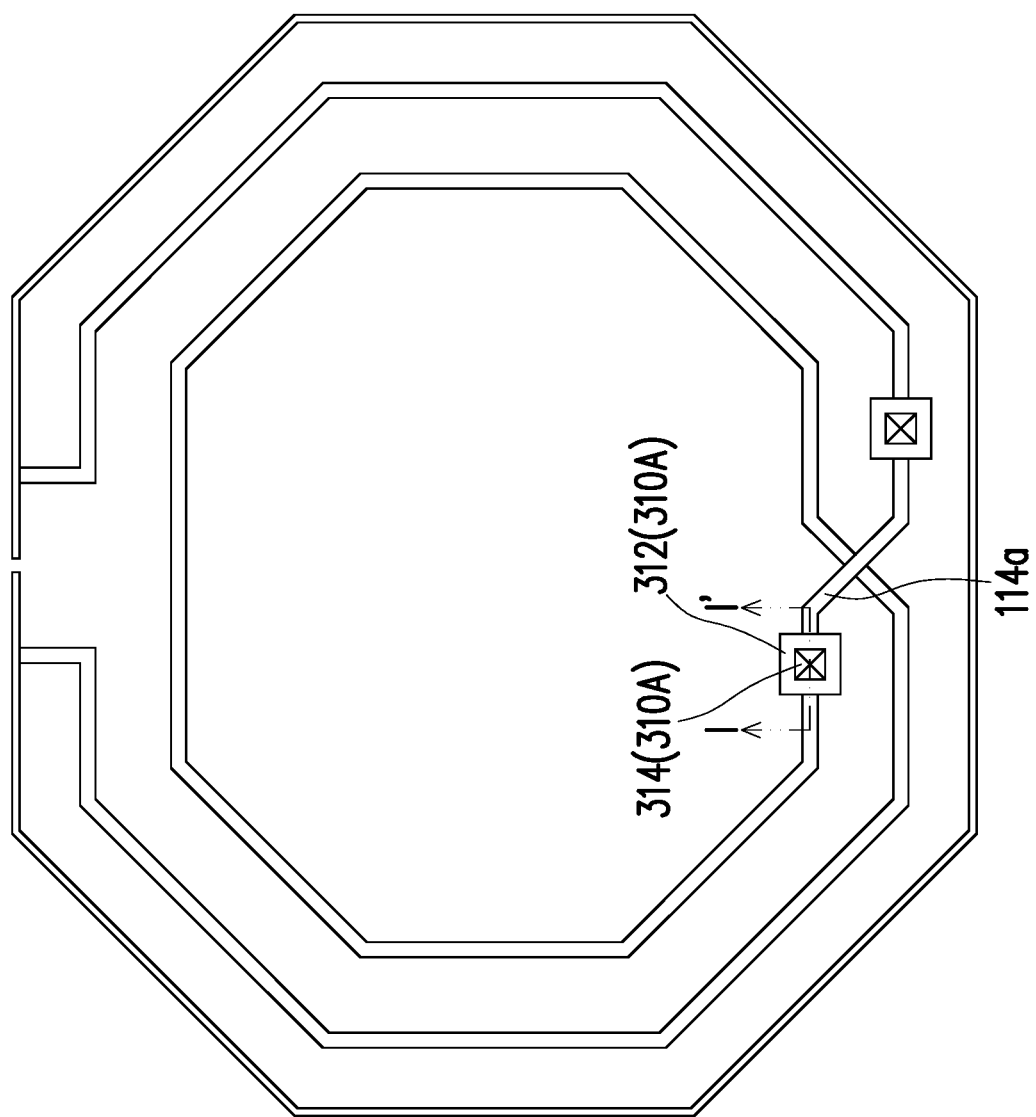

SEMICONDUCTOR PACKAGES

CROSS-REFERENCE TO RELATED APPLICATION

This application is a continuation application of and claims the priority benefit of a prior application Ser. No. 16/658,131, filed on Oct. 20, 2019. The prior application Ser. No. 16/658,131 claims the priority benefits of U.S. provisional application Ser. No. 62/867,855, filed on Jun. 27, 2019. The entirety of each of the above-mentioned patent applications is hereby incorporated by reference herein and made a part of this specification.

BACKGROUND

In recent years, the semiconductor industry has experienced rapid growth due to continuous improvement in integration density of various electronic components, e.g., transistors, diodes, resistors, capacitors, etc. For the most part, this improvement in integration density has come from successive reductions in minimum feature size, which allows more components to be integrated into a given area.

These smaller electronic components also require smaller packages that occupy less area than previous packages. Examples of the type of packages for semiconductors include quad flat pack (QFP), pin grid array (PGA), ball grid array (BGA), flip chips (FC), three-dimensional integrated circuits (3DICs), wafer level packages (WLPs), and package on package (PoP) devices. Some 3DICs are prepared by placing chips over chips on a semiconductor wafer level. The 3DICs provide improved integration density and other advantages, such as faster speeds and higher bandwidth, because of the decreased length of interconnects between the stacked chips. However, there are many challenges related to 3DICs.

BRIEF DESCRIPTION OF THE DRAWINGS

FIG. 11B is a simplified view of an inductor in a semiconductor package of FIG. 11A.

DETAILED DESCRIPTION

Figure 1:
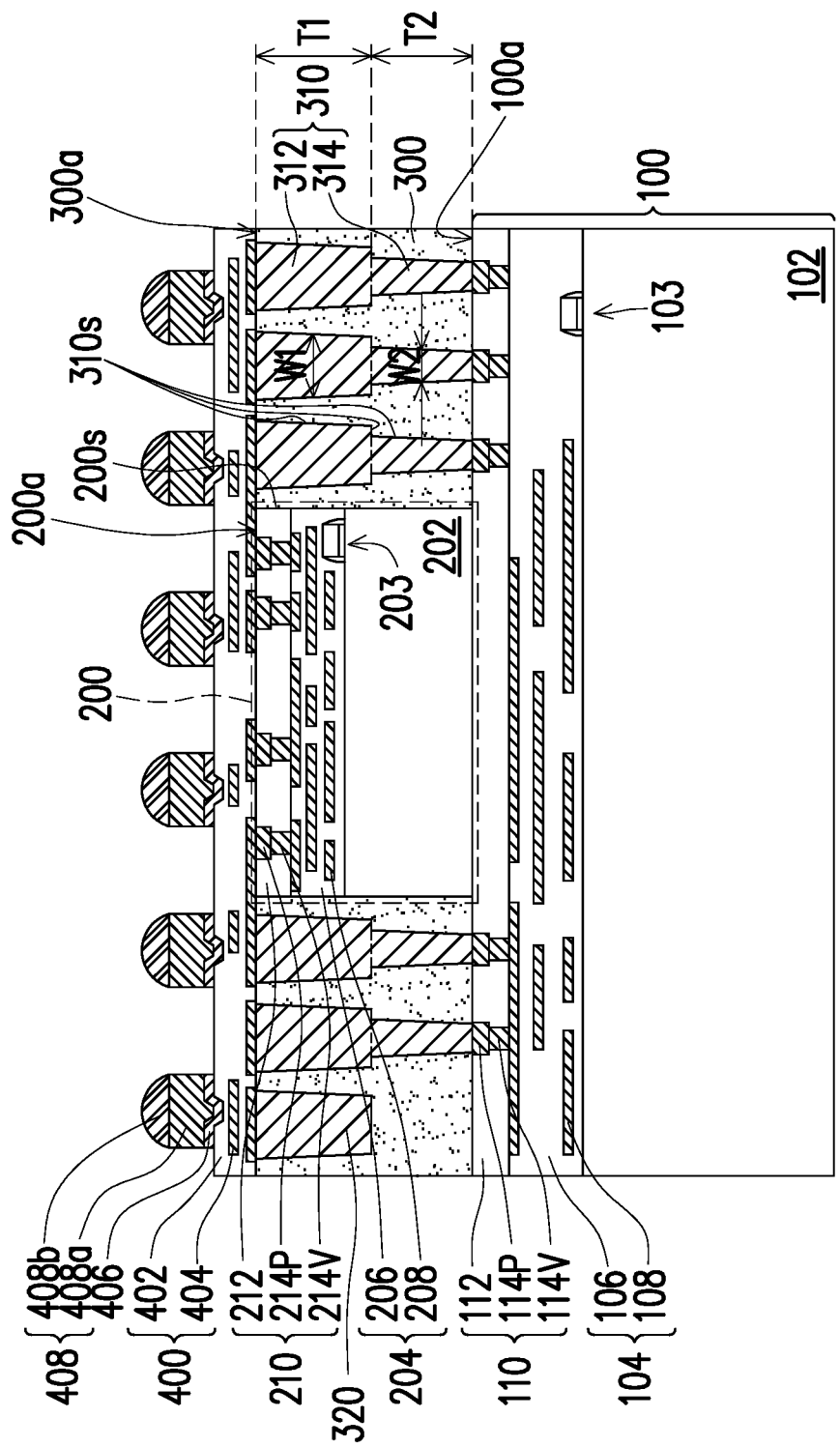
FIG. 1 is a cross-sectional view of a semiconductor package in accordance with some embodiments.

The following disclosure provides many different embodiments, or examples, for implementing different features of the provided subject matter. Specific examples of components and arrangements are described below for the purposes of conveying the present disclosure in a simplified manner. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the same reference numerals and/or letters may be used to refer to the same or similar parts in the various examples the present disclosure. The repeated use of the reference numerals is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein to facilitate the description of one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a cross-sectional view of a semiconductor package in accordance with some embodiments.

Referring to FIG. 1, a first die 100 is provided. The first die 100 may be an application-specific integrated circuit (ASIC) chip, an analog chip, a sensor chip, a wireless and radio frequency chip, a voltage regulator chip or a memory chip, for example. In some embodiments, the first die 100 may include an active component or a passive component. In some embodiments, the first die 100 includes a first semiconductor substrate 102, a first interconnect structure 104 and a first connecting structure 110.

The first semiconductor substrate 102 includes an elementary semiconductor such as silicon, germanium and/or a compound semiconductor such as silicon germanium, silicon carbide, gallium arsenic, indium arsenide, gallium nitride or indium phosphide. In some embodiments, the first semiconductor substrate 102 includes a silicon-containing material. For example, the first semiconductor substrate 102 is a silicon-on-insulator (SOI) substrate or a silicon substrate. In various embodiments, the first semiconductor substrate 102 may take the form of a planar substrate, a substrate with multiple fins, nanowires, or other forms known to people having ordinary skill in the art. Depending on the requirements of design, the first semiconductor substrate 102 may be a P-type substrate or an N-type substrate and may have doped regions therein. The doped regions may be configured for an N-type device or a P-type device. In some embodiments, the first semiconductor substrate 102 may have through substrate vias therein upon the process requirements.

The first semiconductor substrate 102 includes isolation structures defining at least one active area, and at least one first device 103 is disposed on/in the active area. The first device 103 includes one or more functional devices. In some embodiments, the functional devices include active components, passive components, or a combination thereof. In some embodiments, the functional devices may include integrated circuits devices. The functional devices are, for example, transistors, capacitors, resistors, diodes, photodiodes, fuse devices and/or other similar devices. In some embodiments, the first device 103 includes a gate dielectric layer, a gate electrode, source/drain regions, spacers, and the like. In some embodiments, the first die 100 is also referred to as a "first device die".

The first interconnect structure 104 is disposed over a first side (e.g., front side) of the first semiconductor substrate 102. Specifically, the first interconnect structure 104 is disposed over and electrically connected to the first device 103. In some embodiments, the first interconnect structure 104 includes at least one first insulating layer 106 and a plurality of first metal features 108. The first metal features 108 are disposed in the first insulating layer 106 and electrically connected with each other. A portion of the first metal features 108, such as first top metal feature, are exposed by the first insulating layer 106. In some embodiments, the first insulating layer 106 includes an inter-layer dielectric (ILD) layer on the first semiconductor substrate 102, and at least one inter-metal dielectric (IMD) layer over the inter-layer dielectric layer. In some embodiments, the first insulating layer 106 includes silicon oxide, silicon oxynitride, silicon nitride, benzocyclobutene (BCB) polymer, polyimide (PI), polybenzoxazole (PBO) or a combination thereof, and is formed by a suitable process such as spin coating, CVD or the like. The first insulating layer 106 may be a single layer or a multiple-layer structure. In some embodiments, the first metal features 108 include metal vias and metal lines. The plugs may include contacts formed in the inter-layer dielectric layer, and vias formed in the inter-metal dielectric layer. The contacts are formed between and in contact with a bottom metal line and the underlying first device 103. The vias are formed between and in contact with two metal lines. The first metal features 108 may include tungsten (W), copper (Cu), a copper alloy, aluminum (Al), an aluminum alloy or a combination thereof. In some embodiments, a barrier layer may be disposed between each first metal feature 108 and the first insulating layer 106 to prevent the material of the first metal feature 108 from migrating to the underlying first device 103. The barrier layer includes Ta, TaN, Ti, TiN, CoW or a combination thereof, for example. In some embodiments, the first interconnect structure 104 is formed by a dual damascene process. In alternative embodiments, the first interconnect structure 104 is formed by multiple single damascene processes. In yet alternative embodiments, the first interconnect structure 104 is formed by an electroplating process.

The first connecting structure 110 is disposed over the first side (e.g., front side) of the first semiconductor substrate 102. Specifically, the first connecting structure 110 is disposed over the first interconnect structure 104. In some embodiments, the first connecting structure 110 includes at least one first dielectric layer 112 and a plurality of first connecting metal features. In some embodiments, the first dielectric layer 112 includes silicon oxide, silicon nitride, a polymer or a combination thereof. The first connecting metal features are disposed in the first dielectric layer 112 and electrically connected with each other. In some embodiments, the first connecting metal features include first vias 114V electrically connected to the first interconnect structure 104 and first pads 114P electrically connected to the first vias 114V. The first connecting metal features may include tungsten (W), copper (Cu), a copper alloy, aluminum (Al), an aluminum alloy or a combination thereof. In some embodiments, a barrier layer may be disposed between the first connecting metal features and the first dielectric layer 112. The barrier layer includes Ta, TaN, Ti, TiN, CoW or a combination thereof, for example. In some embodiments, the first connecting structure 110 is formed by a dual damascene process. In alternative embodiments, the first connecting structure 110 is formed by multiple single damascene processes. In yet alternative embodiments, the first connecting structure 110 is formed by an electroplating process.

Then, a second die 200 is placed over the first die 100. The second die 200 may be an application-specific integrated circuit (ASIC) chip, an analog chip, a sensor chip, a wireless and radio frequency chip, a voltage regulator chip or a memory chip, for example. The second die 200 and the first die 100 may be the same type or different types of dies. In some embodiments, the second die 200 may include an active component or a passive component. In some embodiments, the second die 200 is smaller than the first die 100.

The second die 200 may have a structure similar to that of the first die 100. In some embodiments, the second die 200 includes a second semiconductor substrate 202, a second interconnect structure 204 and a second connecting structure 210. Thus, the difference between the second die 200 and the first die 100 is illustrated in details below and the similarity between them is not iterated herein.

The second semiconductor substrate 202 may be similar to the first semiconductor substrate 102 in terms of materials and configurations. In some embodiments, the second semiconductor substrate 202 includes isolation structures defining at least one active area, and at least one second device 203 is disposed on/in the active area. The second device 203 includes one or more functional devices. In some embodiments, the functional devices include active components, passive components, or a combination thereof. In some embodiments, the functional devices may include integrated circuits devices. The functional devices are, for example, transistors, capacitors, resistors, diodes, photodiodes, fuse devices and/or other similar devices. In some embodiments, the second device 203 includes a gate dielectric layer, a gate electrode, source/drain regions, spacers, and the like. In some embodiments, the second die 200 is also referred to as a "second device die".

The second interconnect structure 204 may have a structure similar to that of the first interconnect structure 104. In some embodiments, the second interconnect structure 204 is disposed over a first side (e.g., front side) of the second semiconductor substrate 202. Specifically, the second interconnect structure 204 is disposed over and electrically connected to the second device 203. In some embodiments, the second interconnect structure 204 includes at least one second insulating layer 206 and a plurality of second metal features 208. In some embodiments, the second metal features 208 include metal vias and metal lines. The second metal features 208 are disposed in the second insulating layer 206 and electrically connected with each other. A portion of the second metal features 208, such as second top metal features, are exposed by the second insulating layer 206.

The second connecting structure 210 is similar to the first connecting structure 110. Similarly, the second connecting structure 210 is disposed over the first side (e.g., front side) of the second semiconductor substrate 202. Specifically, the second connecting structure 210 is disposed over the second interconnect structure 204. In some embodiments, the second connecting structure 210 includes at least one second dielectric layer 212 and a plurality of second connecting metal features. The second connecting metal features are disposed in the second dielectric layer 212 and electrically connected with each other. In some embodiments, the second connecting metal features include second vias 214V electrically connected to the second interconnect structure 204 and second pads 214P electrically connected to the second vias 214V.

One difference between the second die 200 and the first die 100 lies in the die size. The size of the second die 200 is different from (e.g., less than) the size of the first die 100. Herein, the term "size" is referred to the length, width and/or area. For example, as shown in FIG. 1, the size of the second die 200 is less than the size of the first die 100.

The second die 200 is bonded to the first die 100. In some embodiments, the second die 200 and the first die 100 are back-to-face bonded together through a dielectric-to-dielectric bonding. Specifically, the second die 200 is bonded to the first die 100 with the second semiconductor substrate 202 and the first dielectric layer 112 of the first connecting structure 110. In some embodiments, a dielectric layer (not shown) is formed on a second side (e.g., back side) of the second semiconductor substrate 202, and the second die 200 is bonded to the first die 100 with the dielectric layer and the first dielectric layer 112.

A dielectric encapsulation 300 is formed over the first die 100 and around or aside the second die 200. Specifically, the dielectric encapsulation 300 surrounds a sidewall 200s of the second die 200, exposes a top surface 200a of the second die 200, and overlays a top surface 100a of the first die 100. In some embodiments, the top surface 200a of the second die 200 is substantially coplanar with a top surface 300a of the dielectric encapsulation 300. In some embodiments, the dielectric encapsulation 300 includes silicon oxide, silicon oxynitride, silicon nitride or the like, and is formed by spin-coating, lamination, deposition or the like, and followed by a grinding process or a planarization process. In some alternative embodiments, the dielectric encapsulation 300 includes a polymer material such as polybenzoxazole (PBO), polyimide, benzocyclobutene (BCB), a combination thereof, or the like. In some alternative embodiments, the dielectric encapsulation 300 includes a molding compound, a molding underfill, a resin (such as epoxy) or the like, and is formed by a molding process followed by a grinding process until the top surface 200a of the second die 200 is exposed.

A plurality of through vias 310 are formed in the dielectric encapsulation 300 aside the second die 200. The through vias 310 are electrically connected to the first die 100 through the first pads 114P. The through vias 310 are formed to surround the second die 200. In other words, the through vias 310 may be disposed at the sidewall 200s of the second die 200. In some embodiments, the through via 310 includes a plurality of portions having different widths. For example, the through via 310 includes a first portion 312 having a first width W1 and a second portion 314 having a second width W2 different from the first width W1. In some embodiments, the first portion 312 may be also referred as to a through dielectric metal (TDM), and the second portion 314 may be also referred as to a through dielectric via (TDV). The first portion 312 and the second portion 314 are physically and electrically connected, and the second portion 314 is disposed between the first portion 312 and the first die 100. Since the first portion 312 and the second portion 314 have different width, a sidewall 310s of the through via 310 is step-shaped as shown in FIG. 1. The sidewall 310s of the through via 310 has zig-zag geometry. In some embodiments, the second width W2 is smaller than the first width W1. The first width W1 and the second width W2 are respectively in a range of 1 µm to 100 µm, for example. The first portion 312 has a first thickness T1, and the second portion 314 has a second thickness T2. The first thickness T1 may be the same as or different from the second thickness T2. A total thickness (i.e., a total thickness of the first thickness T1 and the second thickness T2) of the through vias 310 is in a range of 10 µm to 100 µm, for example.

In some embodiments, the through vias 310 includes a conductive layer. The through vias 310 may be formed by a dual damascene process, multiple single damascene processes or other suitable methods. The conductive layer includes aluminum, titanium, copper, nickel, tungsten, and/or alloys thereof. In some embodiments, the through vias 310 may further include a seed layer (not shown) between the conductive layer and the dielectric encapsulation 300. For example, the seed layer is continuously disposed on the step-shaped sidewall 310s and a bottom connecting the sidewall 310s. The seed layer may include a titanium/copper composite layer and is formed by a sputtering process. In some alternative embodiments, a barrier layer (not shown) may be disposed between the seed layer and the dielectric encapsulation 300. The barrier layer includes Ta, TaN, Ti, TiN, CoW or a combination thereof, for example.

In some embodiments, at least one via 320 is formed aside the through vias 310. The via 320 is extended into the dielectric encapsulation 300 from the top surface of the dielectric encapsulation 300. The via 320 is formed without penetrating the dielectric encapsulation 300, and thus the via 320 is not electrically connected to the first die 100. The via 320 may be formed simultaneously with the first portion 312 of the through vias 310. Therefore, a material and a profile of the via 320 may be similar to or substantially the same as the first portion 312 of the through vias 310. For example, a length and a width of the via 320 are substantially the same as those of the first portion 312 of the through vias 310. However, the invention is not limited thereto. In some alternative embodiments, a length and a width of the via 320 may be different from those of the first portion 312 of the through vias 310.

A redistribution layer structure 400 is formed over the second die 200, the through vias 310 and the dielectric encapsulation 300. The redistribution layer structure 400 includes at least one dielectric layer 402 and at least one conductive layer 404 stacked alternately. In some embodiments, a portion of the redistribution layer structure 400 is electrically connected to the second interconnect structure 204 of the second die 200, and another portion of the redistribution layer structure 400 is electrically connected to the through vias 310. In addition, in some embodiments, a portion of the redistribution layer structure 400 is electrically connected to the via 320. In some embodiments, the dielectric layer 402 includes silicon oxide, silicon oxynitride, silicon nitride, a polymer-based dielectric material such as polybenzoxazole (PBO), polyimide (PI), benzocyclobutene (BCB), a combination thereof or the like. In some embodiments, the conductive layer 404 includes copper, nickel, titanium, a combination thereof or the like. In some embodiments, a barrier layer may be disposed between the conductive layer 404 and the dielectric layer 402. The barrier layer includes Ta, TaN, Ti, TiN, CoW or a combination thereof, for example. In some embodiments, the redistribution layer structure 400 is formed by a dual damascene process. In alternative embodiments, the redistribution layer structure 400 is formed by multiple single damascene processes. In yet alternative embodiments, the redistribution layer structure 400 is formed by an electroplating process.

Thereafter, pads 406 are formed over the redistribution layer structure 400. In some embodiments, the pads 406 are under bump metallization (UBM) pads for mounting conductive connectors such as conductive pillars, micro-bumps or the like. The pads 406 include a metal or a metal alloy. The pads 406 include aluminum, copper, nickel, or an alloy thereof.

Afterwards, terminal connectors 408 are disposed on and electrically connected to the redistribution layer structure 400. The terminal connectors 408 may include solder material including alloys of tin, lead, silver, copper, nickel, bismuth, or combinations thereof. In some embodiments, the terminal connectors 408 may be arranged in an array. For example, the terminal connectors 408 include conductive pillars, micro-bumps, controlled collapse chip connection (C4) bumps, ball grid array (BGA), electroless nickel-electroless palladium-immersion gold (ENEPIG) technique formed bumps, combination thereof (e.g., a metal pillar 408a having a solder cap 408b attached thereof as shown in FIG. 1), or the like. After the terminal connectors 408 is formed, a semiconductor package 10 of the application is thus completed. In some embodiments, the semiconductor package 10 may be integrated as a System-on-Integrated-Chips (SoIC) package, a Chip on Wafer on Substrate (CoWoS) or an integrated fan out (InFo) wafer level package.

Figure 2:
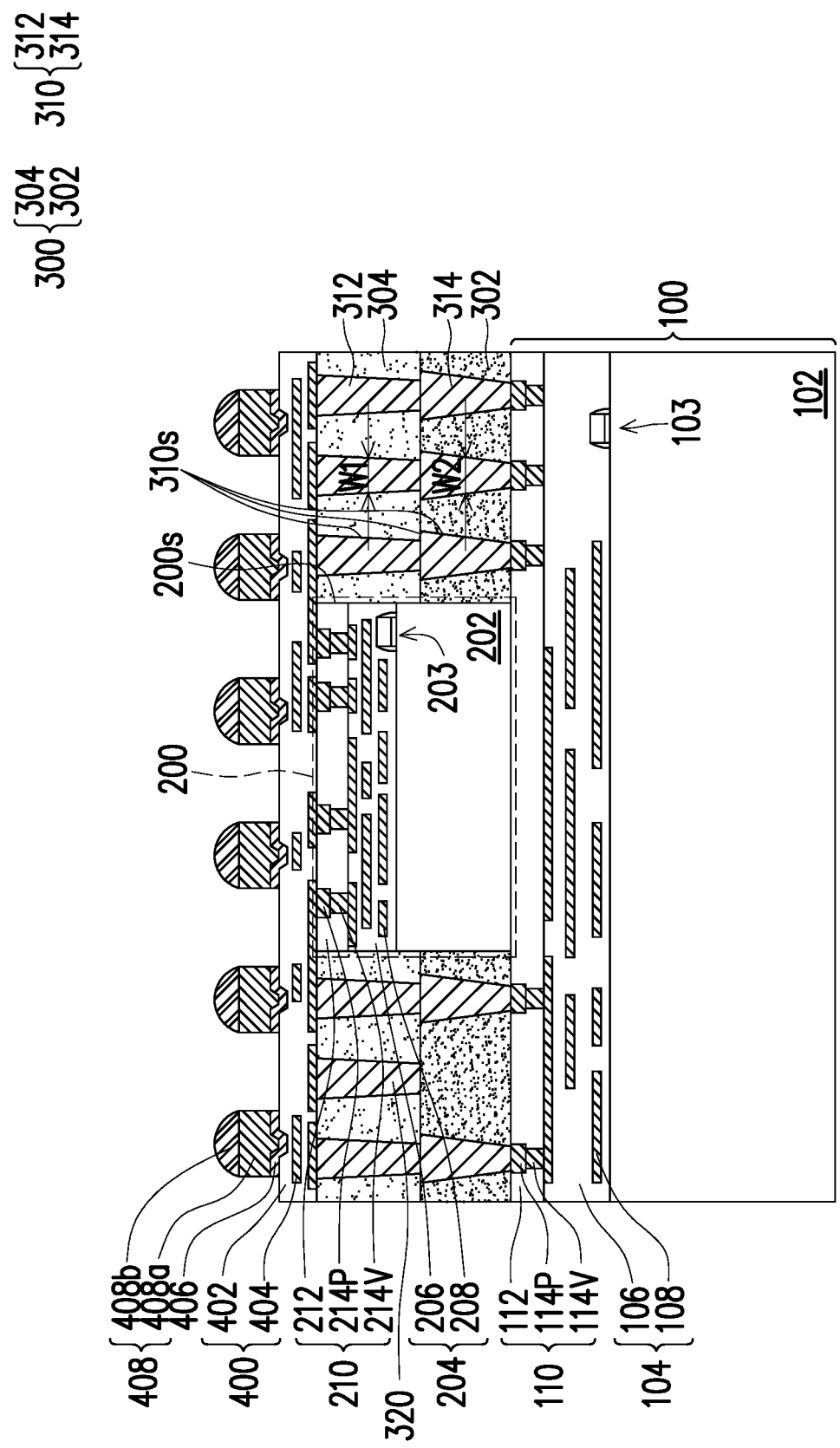
FIG. 2 is a cross-sectional view of a semiconductor package in accordance with some embodiments.

In some embodiments, the upper portion (i.e., the first portion 312) of the through via 310 has a larger width than the lower portion (i.e., the second portion 314). However, the invention is not limited thereto. In some alternative embodiments, as shown in FIG. 2, the second width W2 of the second portion 314 is larger than the first width W1 of the first portion 312. The through via 310 may be formed by the following steps. First, after the second die 200 is bonded to the first die 100, a dielectric layer 302 is formed over the first die 100 to encapsulate a lower portion of the sidewall 200s of the second die 200. Then, a plurality of openings are formed in the dielectric layer 302, and the second portions 314 are formed in the openings. After that, a dielectric layer 304 is formed over the dielectric layer 302 to encapsulate an upper portion of the sidewall 200s of the second die 200. A material of the dielectric layer 304 is different from a material of the dielectric layer 302, for example. However, in some alternative embodiments, a material of the dielectric layer 304 is the same as a material of the dielectric layer 302. Then, a plurality of openings are formed in the dielectric layer 304, and the first portions 312 and the via 320 are formed in the openings. A material of the first portion 312 and the via 320 may be different from or the same as a material of the second portion 314. In some embodiments, the dielectric encapsulation 300 includes the dielectric layer 302 and the dielectric layer 304, and the dielectric encapsulation 300 encapsulates the second die 200 and the through vias 310. In some embodiments, the first portion 312 of the through via 310 is disposed in the dielectric layer 304 and has the first width W1, the second portion 314 of the through via 310 is disposed in the dielectric layer 302 and has the second width W2, and the sidewall 310s of the through via 310 is step-shaped.

Figure 3A:
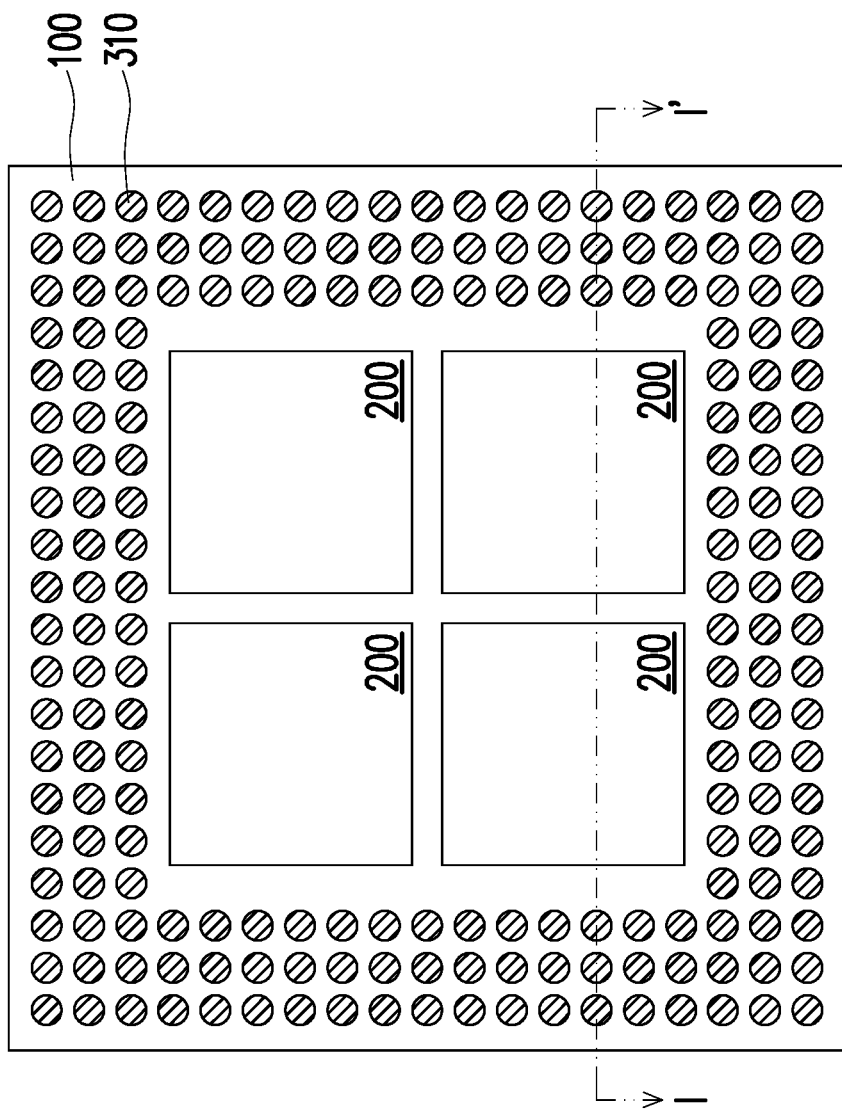
FIG. 3A is a top view of a semiconductor package in accordance with some embodiments.
Figure 3B:
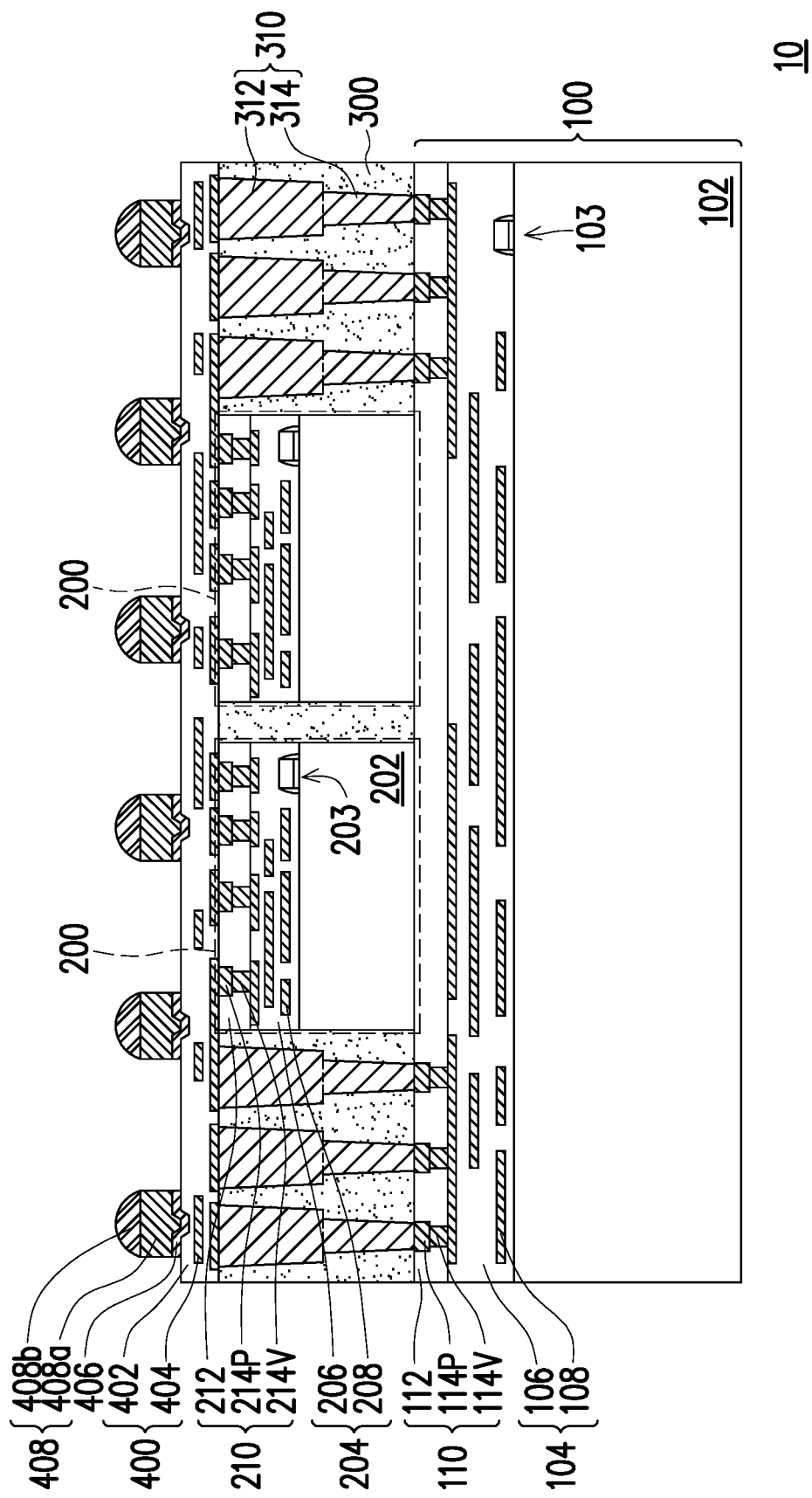
FIG. 3B is a cross-sectional view along I-I' line of FIG. 3A.

In the above embodiments, one second die 200 is illustrated. However, the invention is not limited thereto. In some alternative embodiments, as shown in FIG. 3A and FIG. 3B which is a cross-sectional view along I-I' line of FIG. 3A, a plurality of second dies 200 are disposed over the first die 100. The second dies 200 are bonded to the first die 100 and arranged side by side over the first die 100. The through vias 310 are formed to surround the second dies 200.

Figure 4:
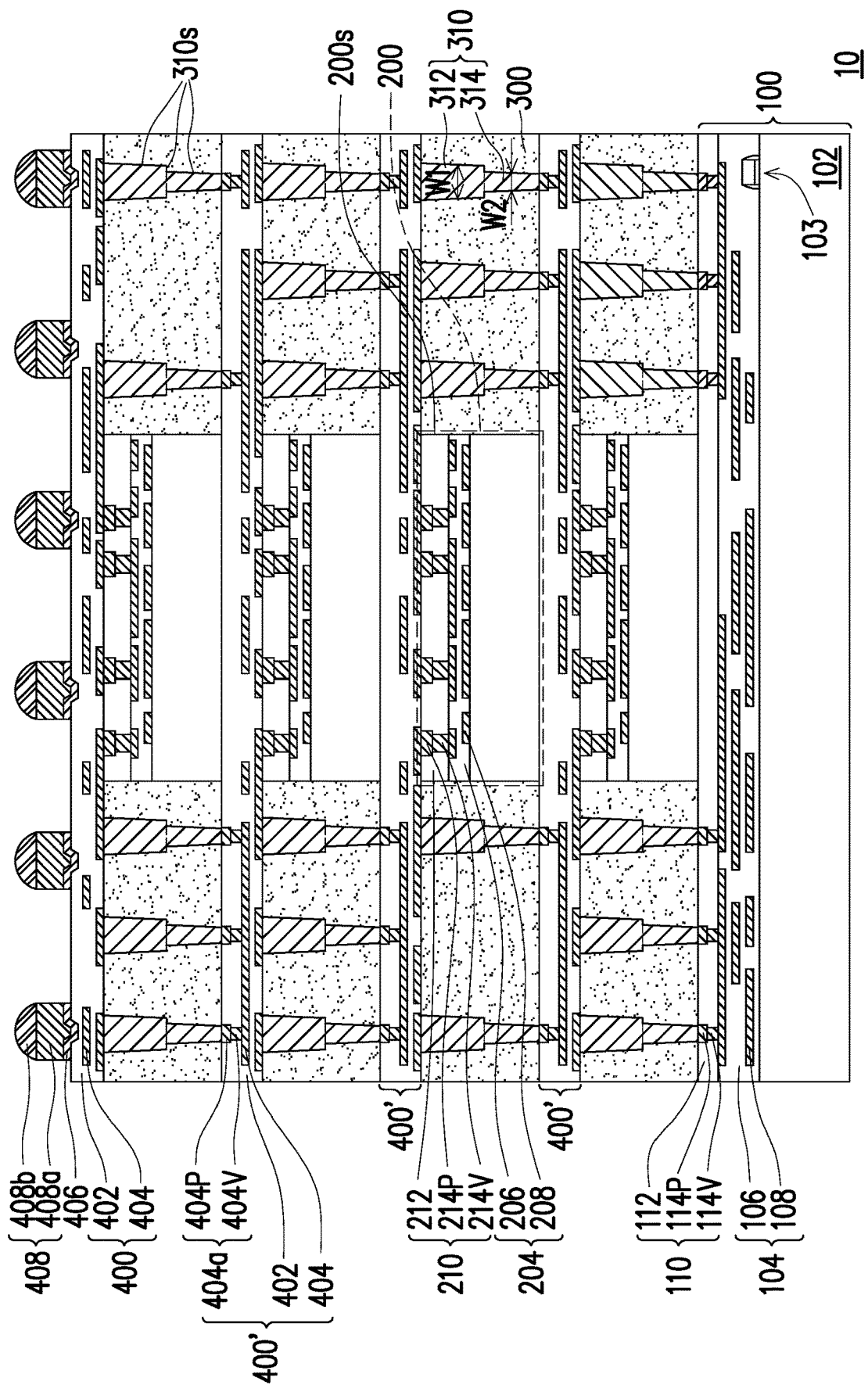
FIG. 4 is a cross-sectional view of a semiconductor package in accordance with some embodiments.
Figure 5:
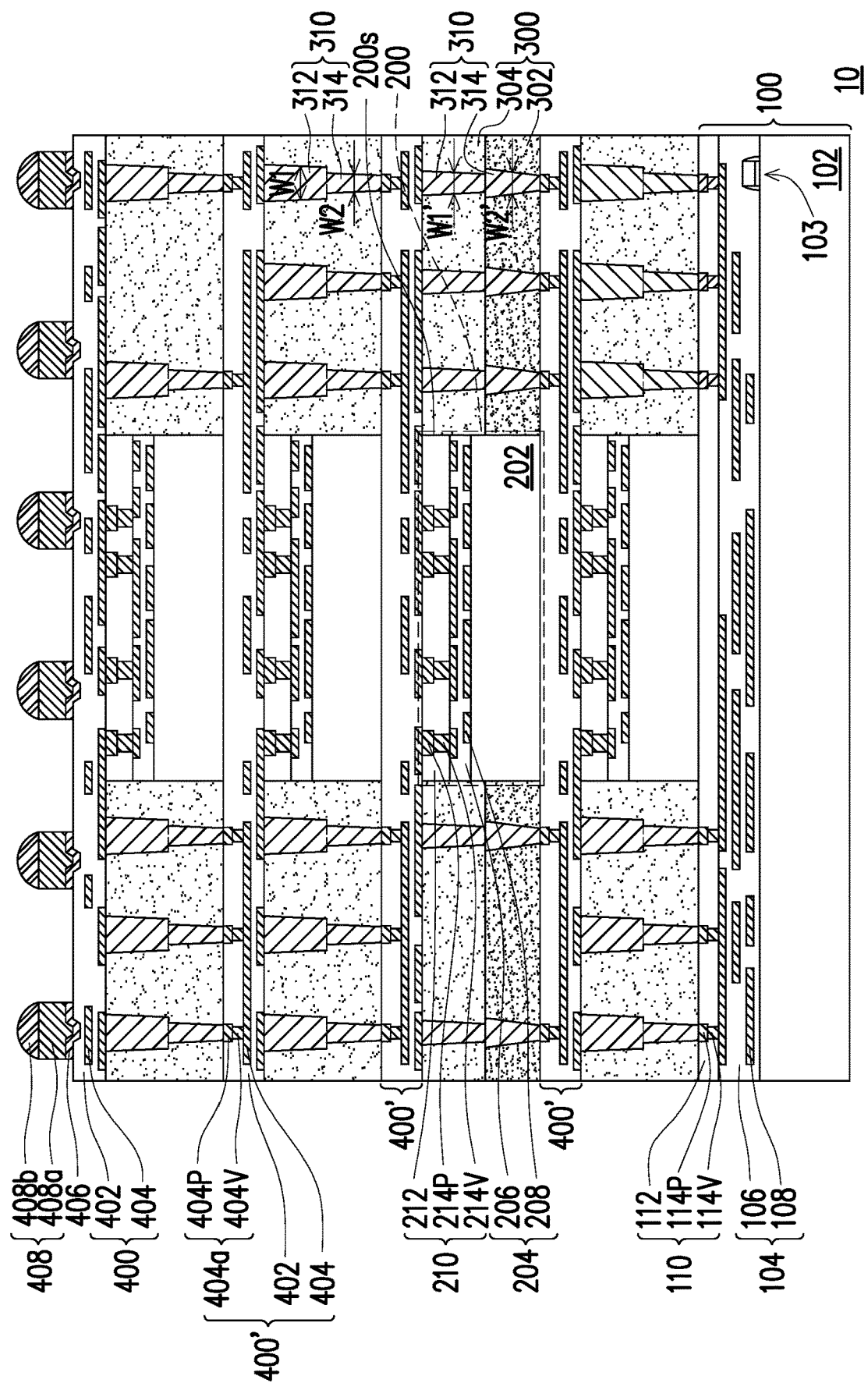
FIG. 5 is a cross-sectional view of a semiconductor package in accordance with some embodiments.

In some alternative embodiments, as shown in FIGS. 4 and 5, a plurality of second dies 200 are stacked onto the first die 100. The second die 200 is encapsulated by the dielectric encapsulation 300, and a plurality of through vias 310 are formed in the dielectric encapsulation 300 aside the second die 200. The redistribution layer structure 400, 400' is formed over the second die 200 and the adjacent dielectric encapsulation 300. The redistribution layer structure 400, 400' includes at least one dielectric layer 402 and at least one conductive layer 404 stacked alternately. The redistribution layer structure 400' is disposed between two stacking second dies 200 and two stacking dielectric encapsulations 300. In some embodiments, the topmost conductive layer 404a of the redistribution layer structure 400' may include vias 404V electrically connected to the underlying conductive layer 404 and pads 404P electrically connected to the vias 404V. The vias 404V are disposed between and in contact with the through vias 310 and the pads 404P. The redistribution layer structures 400, 400' are electrically connected to the first die 100 through the through vias 310 therebetween. In some embodiments, as shown in FIG. 4, each through via 310 has a similar profile. For example, the first width W1 of the first portion 312 of the through via 310 is larger than the second width W2 of the second portion 314. However, the invention is not limited thereto. In some alternative embodiments, as shown in FIG. 5, the first width W1 of the first portion 312 of some through vias 310 is larger than the second width W2 of the second portion 314 while the first width W1' of the first portion 312 of some through vias 310 is smaller than the second width W2' of the second portion 314.

Figure 6:
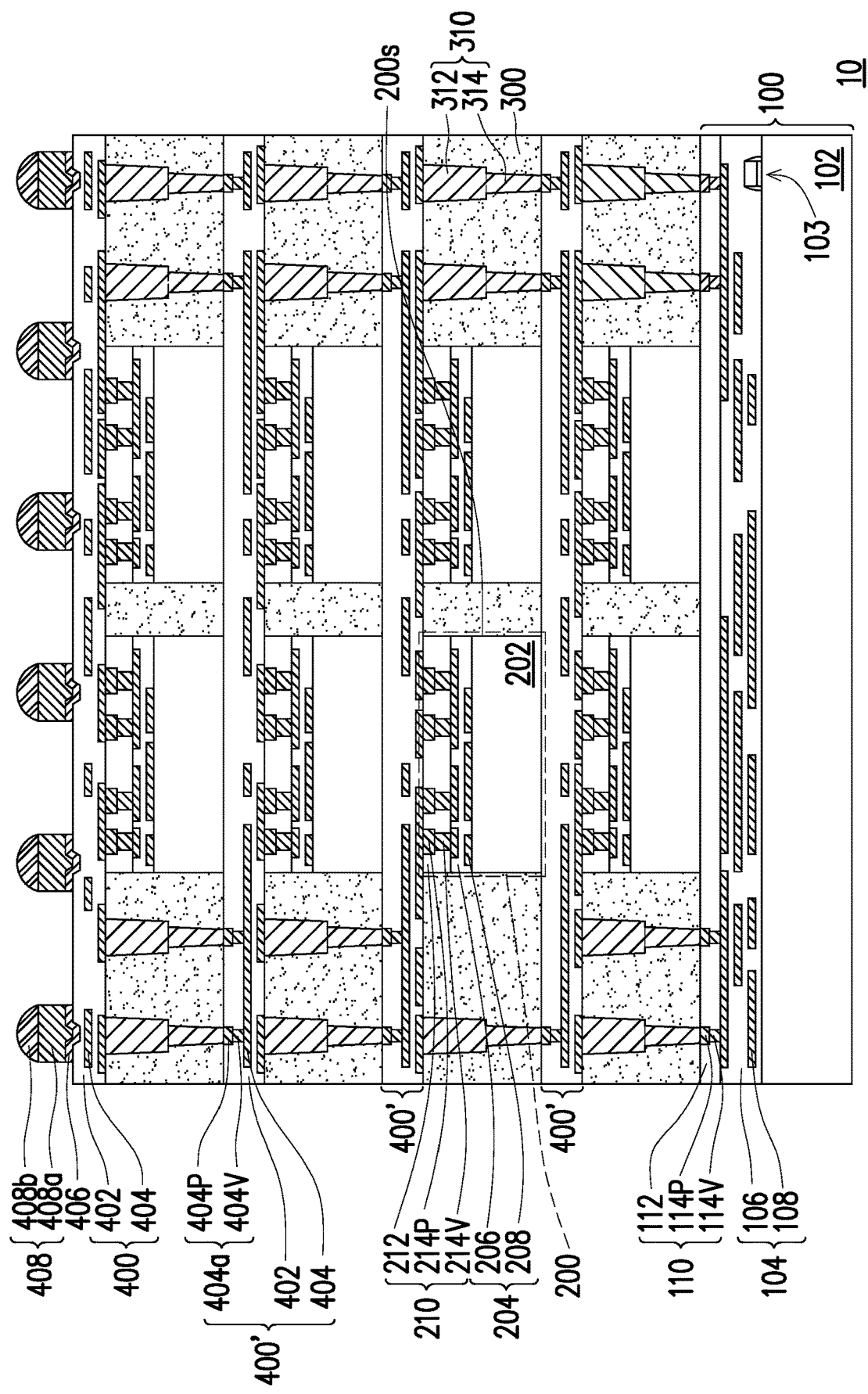
FIG. 6 is a cross-sectional view of a semiconductor package in accordance with some embodiments.
Figure 7:
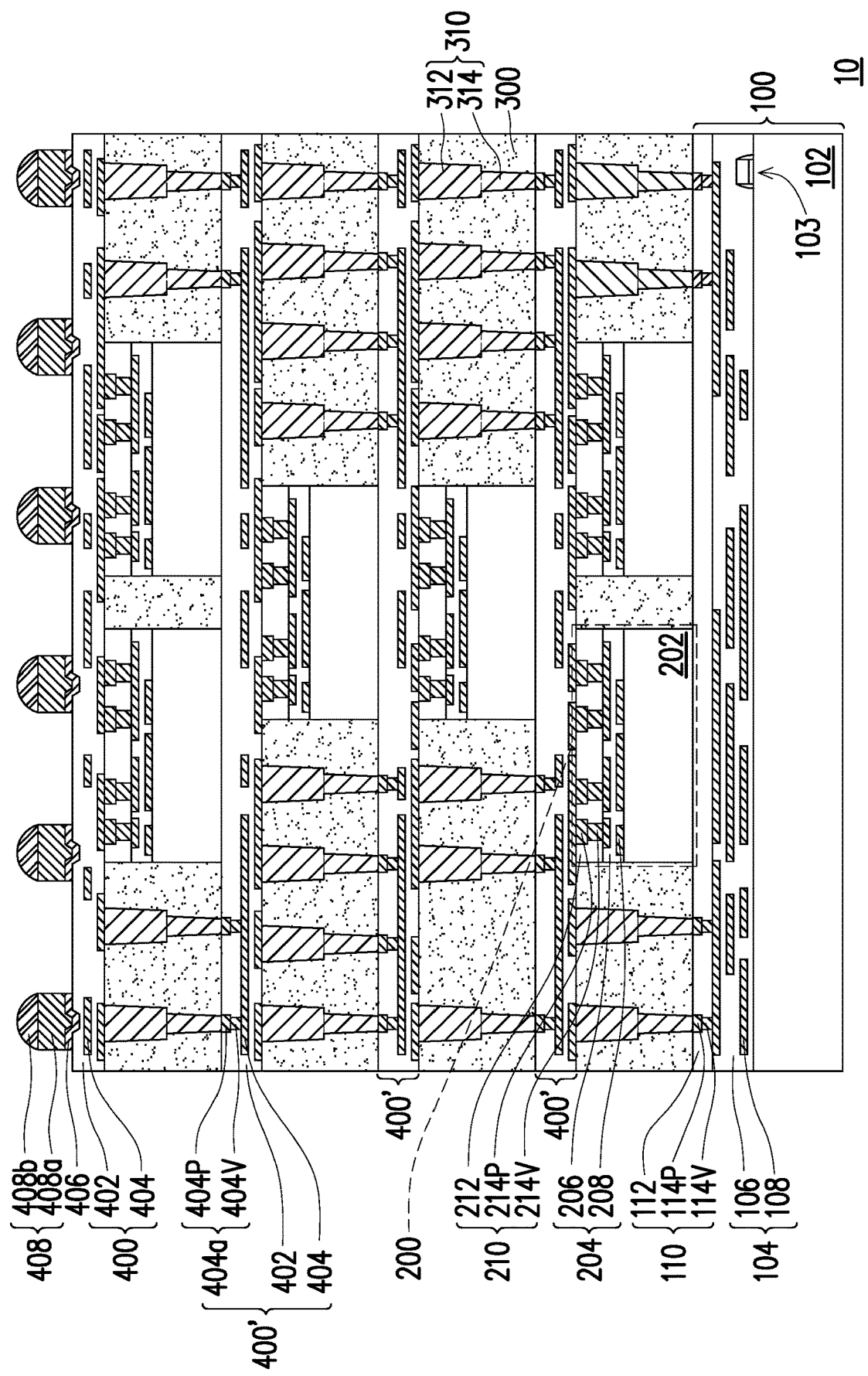
FIG. 7 is a cross-sectional view of a semiconductor package in accordance with some embodiments.
Figure 8:
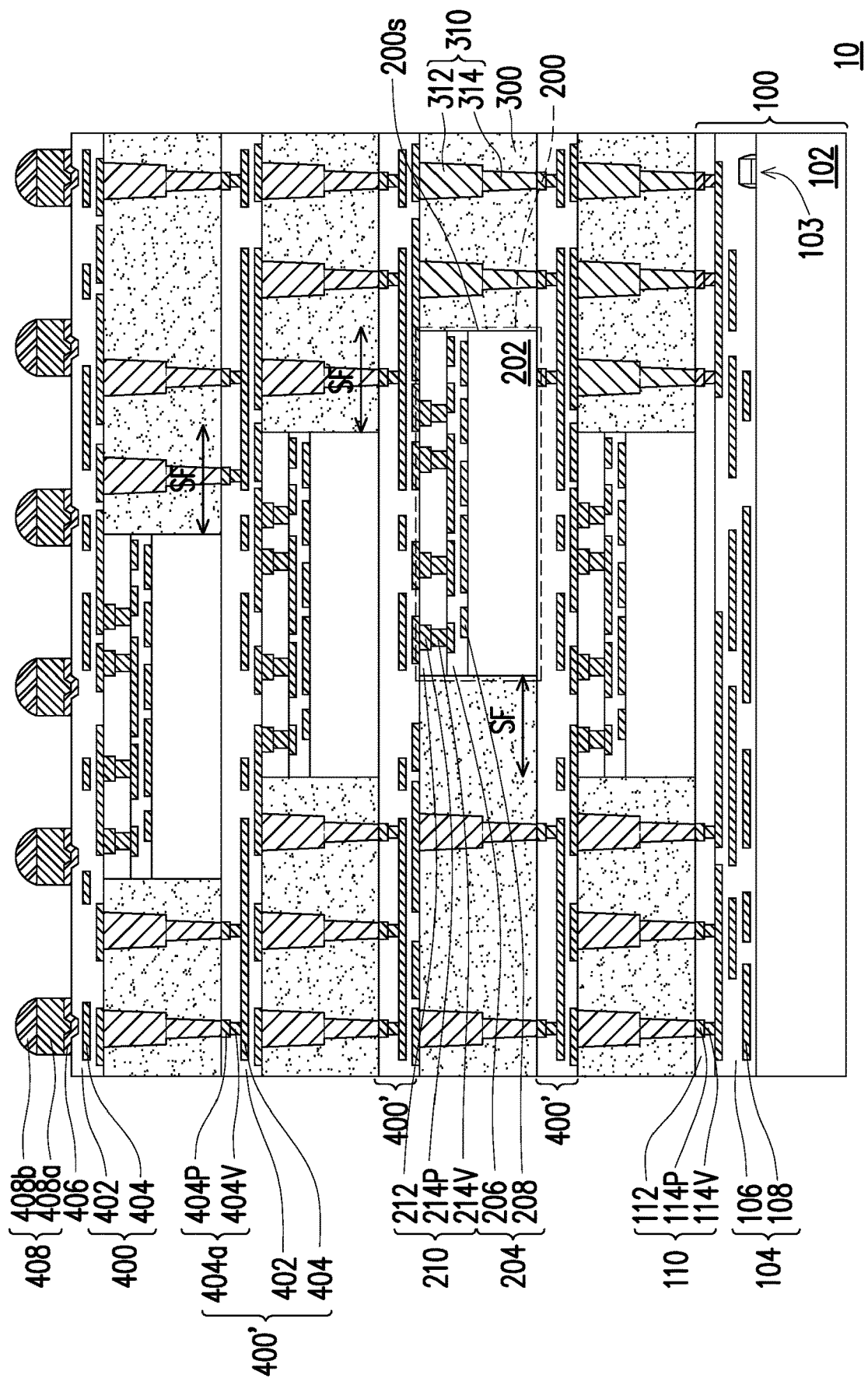
FIG. 8 is a cross-sectional view of a semiconductor package in accordance with some embodiments.
Figure 9:
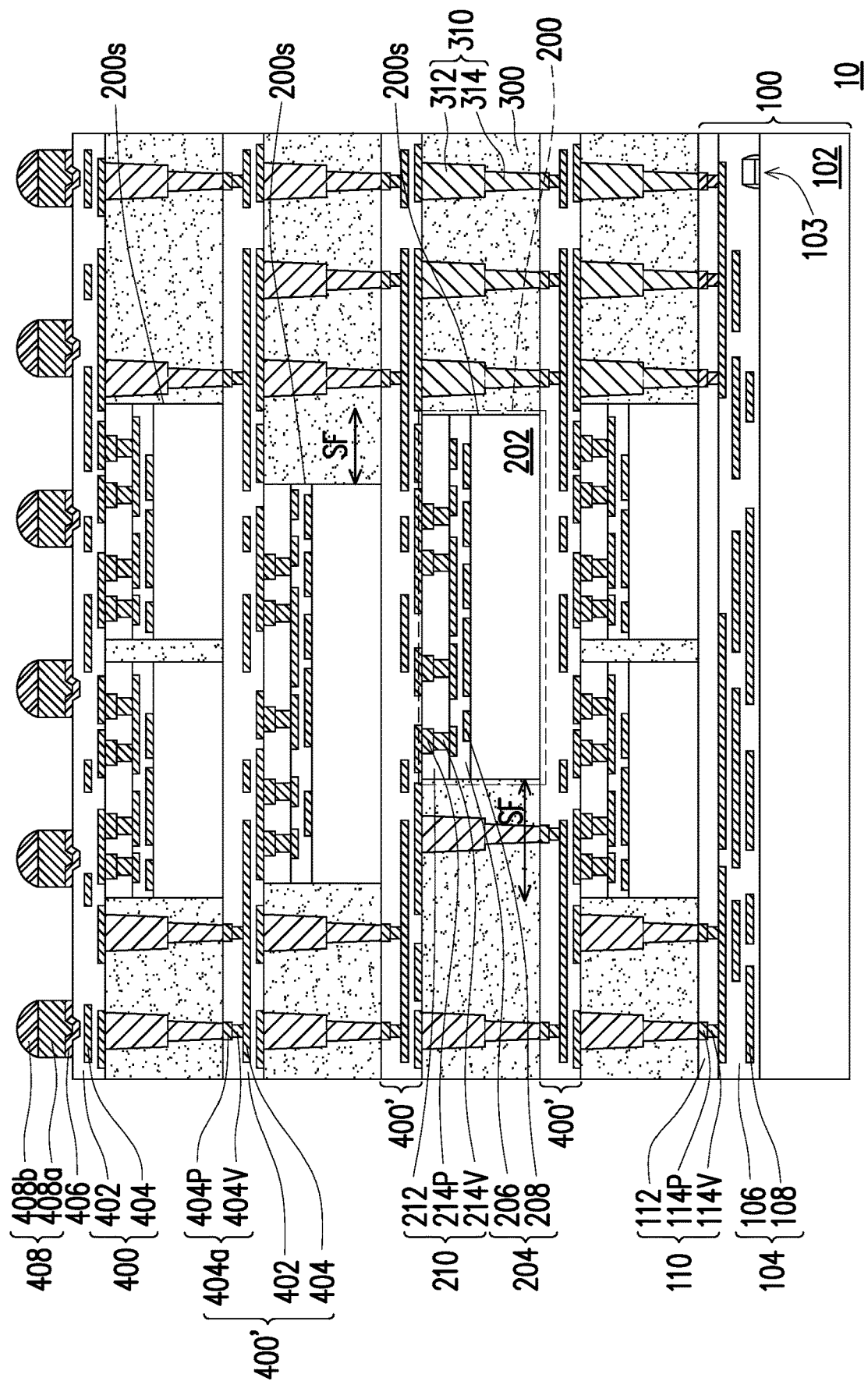
FIG. 9 is a cross-sectional view of a semiconductor package in accordance with some embodiments.

In the embodiments of FIGS. 4 and 5, each dielectric encapsulation 300 encapsulates one second die 200. However, the invention is not limited thereto. In some alternative embodiments, as shown in FIGS. 6 and 7, the dielectric encapsulation 300 encapsulates one or more than one second die 200. In addition, in the above embodiments, the second dies 200 of different layers are shown as aligning to each other. For example, as shown in FIGS. 4 to 6, the sidewall 200s of the upper second die 200 is aligned with the sidewall 200s of the lower second die 200. However, the invention is not limited thereto. In some alternative embodiments, as shown in FIGS. 8 and 9, the sidewall 200s of the upper second die 200 is not aligned with the sidewall 200s of the lower second die 200, in other words, a shift SF is formed between the sidewall 200s of the upper second die 200 and the sidewall 200s of the lower second die 200. In addition, as shown in FIG. 9, the second dies 200 of different layers may have different size (e.g., width). Furthermore, the second dies 200 of the same layer may have different size (e.g., width).

Figure 10A:
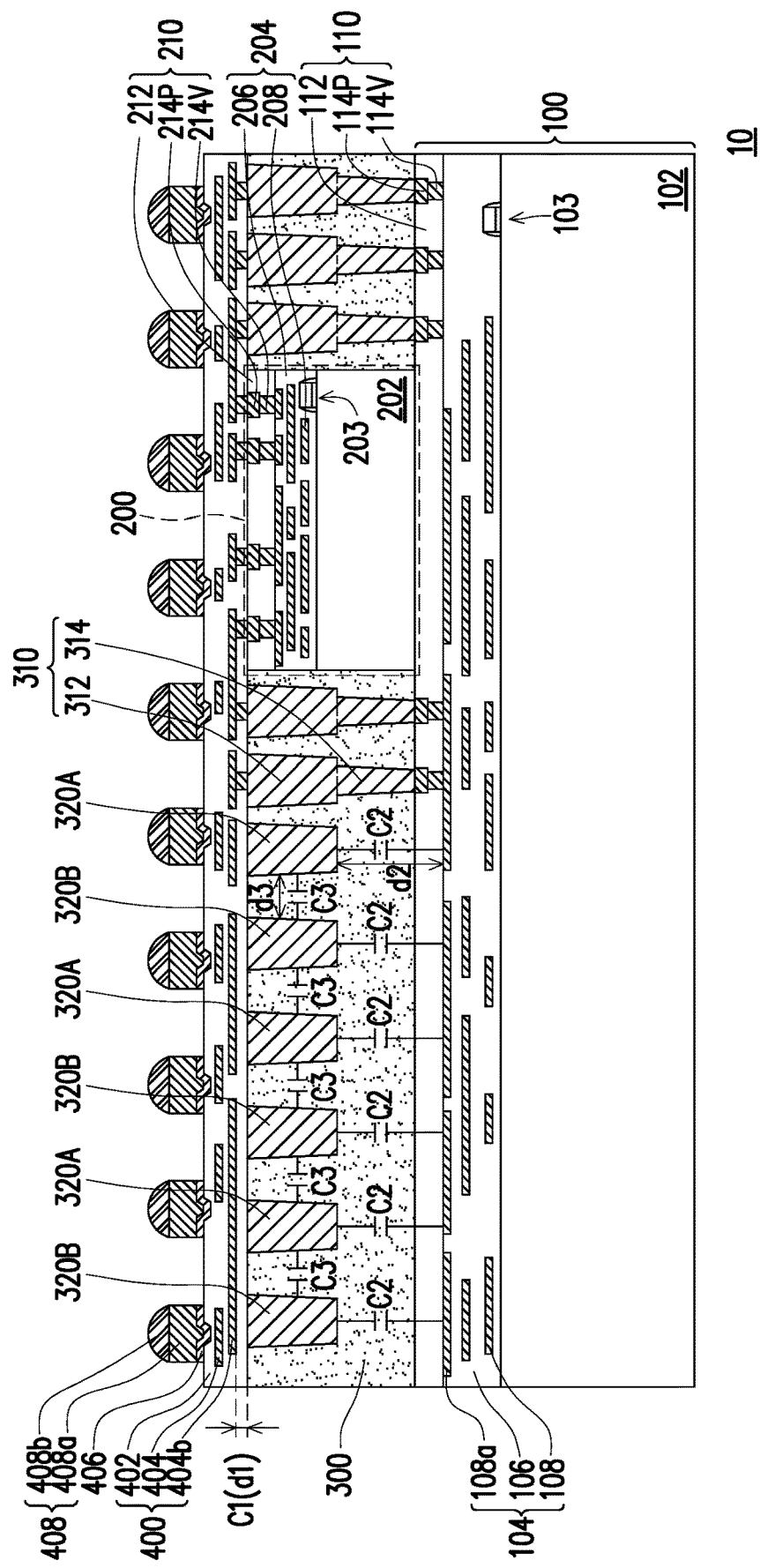
FIG. 10A is a cross-sectional view of a semiconductor package in accordance with some embodiments.
Figure 10B:
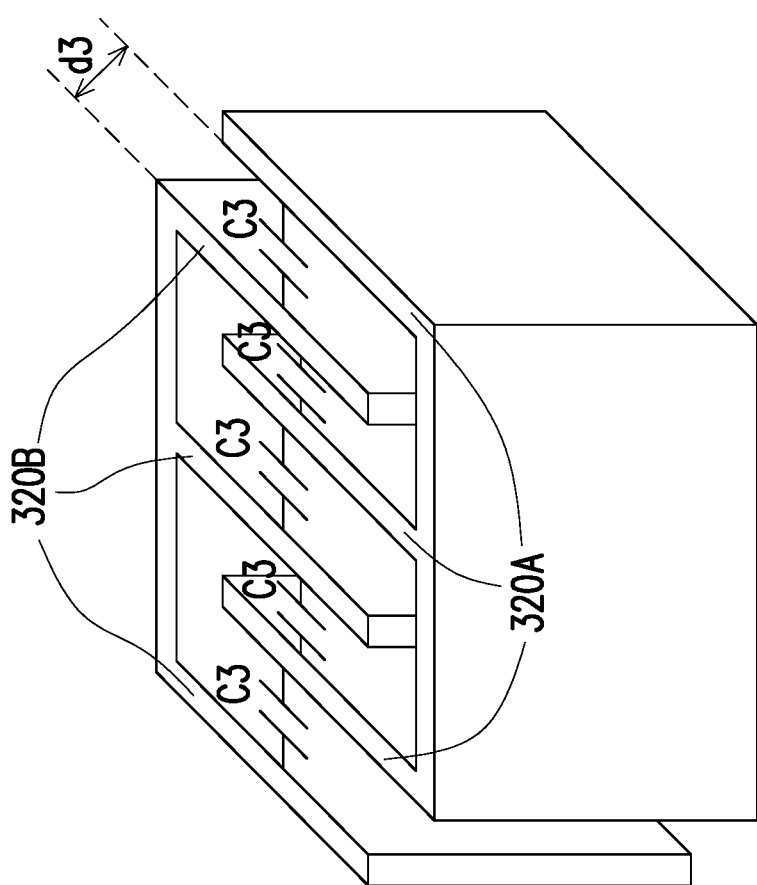
FIG. 10B is a simplified view of first vias and second vias in a semiconductor package of FIG. 10A.

In some embodiments, the vias 320 and/or through vias 310 are formed to provide additional routing layer for capacitor, inductor, transmission line or the like. For example, as shown in FIG. 10A, a plurality of first vias 320A and a plurality of second vias 320B are formed aside the through vias 310 in the dielectric encapsulation 300. The first vias 320A and the second vias 320B are alternately disposed and have top surfaces substantially coplanar with a top surface of the through vias 310. In some embodiments, the first via 320A is electrically isolated from the redistribution layer structure 400 and the first die 100. Accordingly, a capacitor C1 is formed between the bottommost conductive layer 404b and the first via 320A, and a capacitor C2 is formed between the first via 320A and a metal feature 108a. The value of the capacitor C1 depends on the distance d1 between the bottommost conductive layer 404b and the first via 320A. Similarly, the value of the capacitor C2 depends on the distance d2 between the first via 320A and the metal feature 108a. For example, the value of the capacitor C1 increases as the distance d1 becomes smaller, and the value of the capacitor C2 increases as the distance d2 becomes smaller. In addition, in some embodiments, as show in FIG. 10B, the first vias 320A of FIG. 10A may be physically connected to each other to form a comb-shaped structure, and similarly, the second vias 320B of FIG. 10A may be physically connected to each other to form a comb-shaped structure. Since the first vias 320A and the second vias 320B are electrically isolated by the dielectric encapsulation 300 therebetween, a capacitor C3 is formed between each adjacent two of the first vias 320A and the second vias 320B. The value of the capacitor C3 may be adjusted by controlling the distance d3 between the first via 320A and the second via 320B, the area of the first via 320A facing to the second via 320B and the area of the second via 320B facing to the first via 320A. For example, the value of the capacitor C3 increases as the distance d3 between the first via 320A and the second via 320B becomes smaller, and the value of the capacitor C3 increases as the above area becomes larger.

Figure 11A:
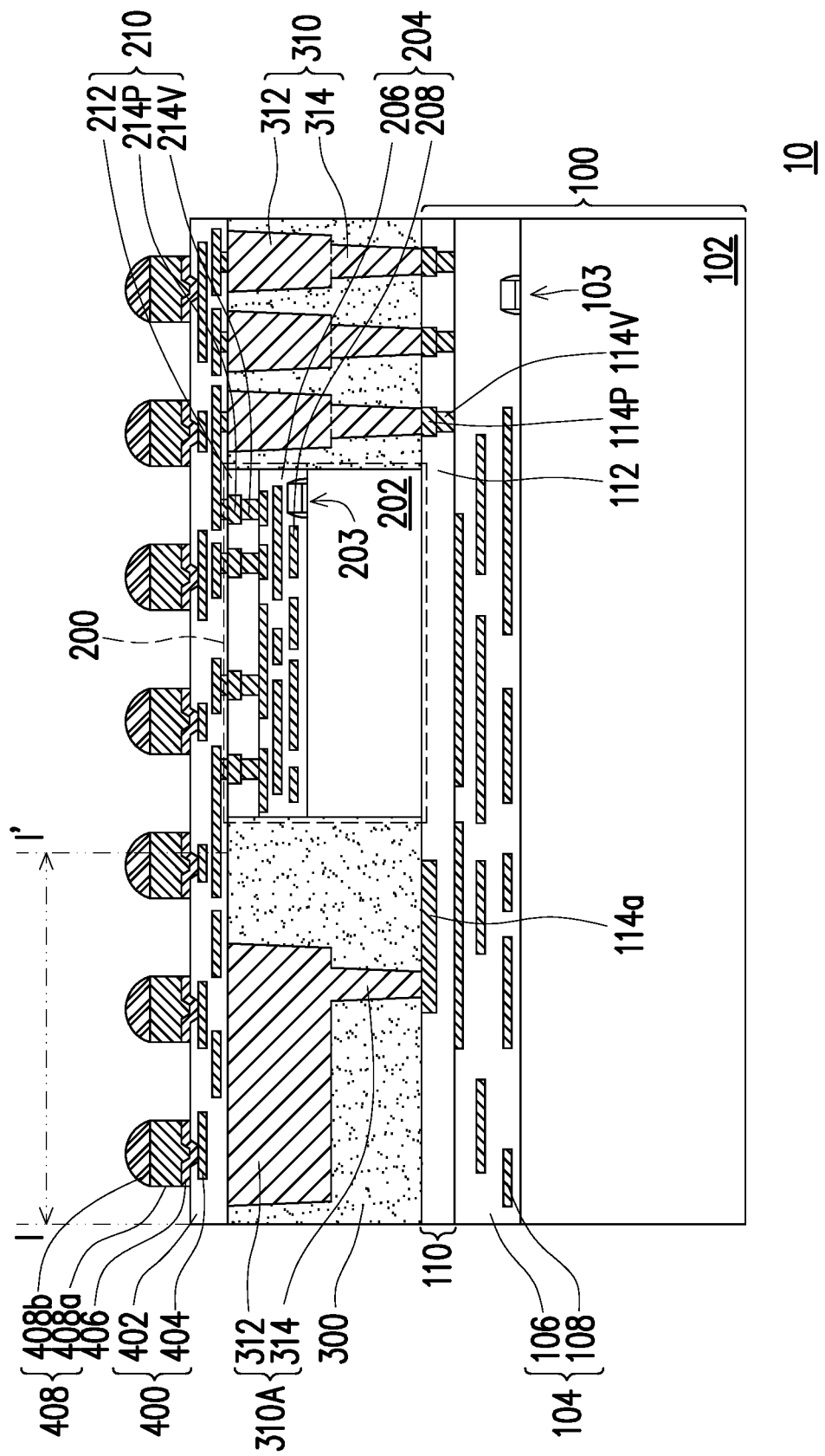
FIG. 11A is a cross-sectional view of a semiconductor package in accordance with some embodiments.

In some embodiments, as shown in FIGS. 11A and 11B, the first portion 312 of the through via 310A, the second portion 314 of the through via 310A and the metal feature 114a form parts of an inductor IND. The through via 310A is electrically connected to the metal feature 114a of the first die 100. In some embodiments, the first portion 312 of the through via 310A, the second portion 314 of the through via 310A and the metal feature 114a are of different layers, and the second portion 314 is disposed between the first portion 312 and the metal feature 114a. Thus, a portion of the inductor IND in the lower layer (i.e., the metal feature 114a) is connected to a portion of the inductor IND in the upper layer (i.e., the first portion 312) through the second portion 314 therebetween. In addition, the Q value of the inductor IND may be adjusted by controlling the thickness T1 of the first portion 312 of the through via 310A. For example, the Q value of the inductor IND increases as the thickness T1 of the first portion 312 becomes larger.

Figure 12:
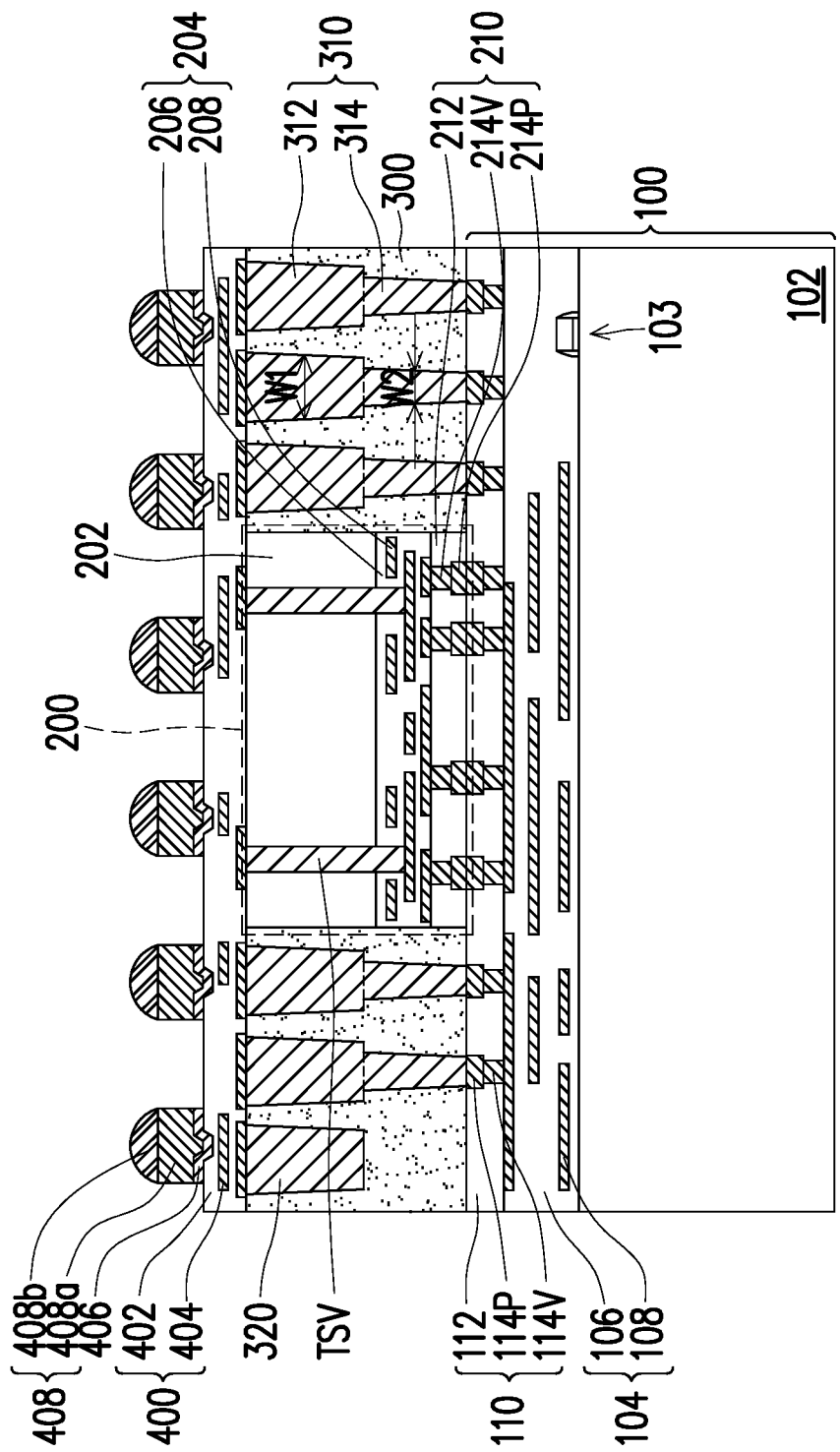
FIG. 12 is a cross-sectional view of a semiconductor package in accordance with some embodiments.
Figure 13:
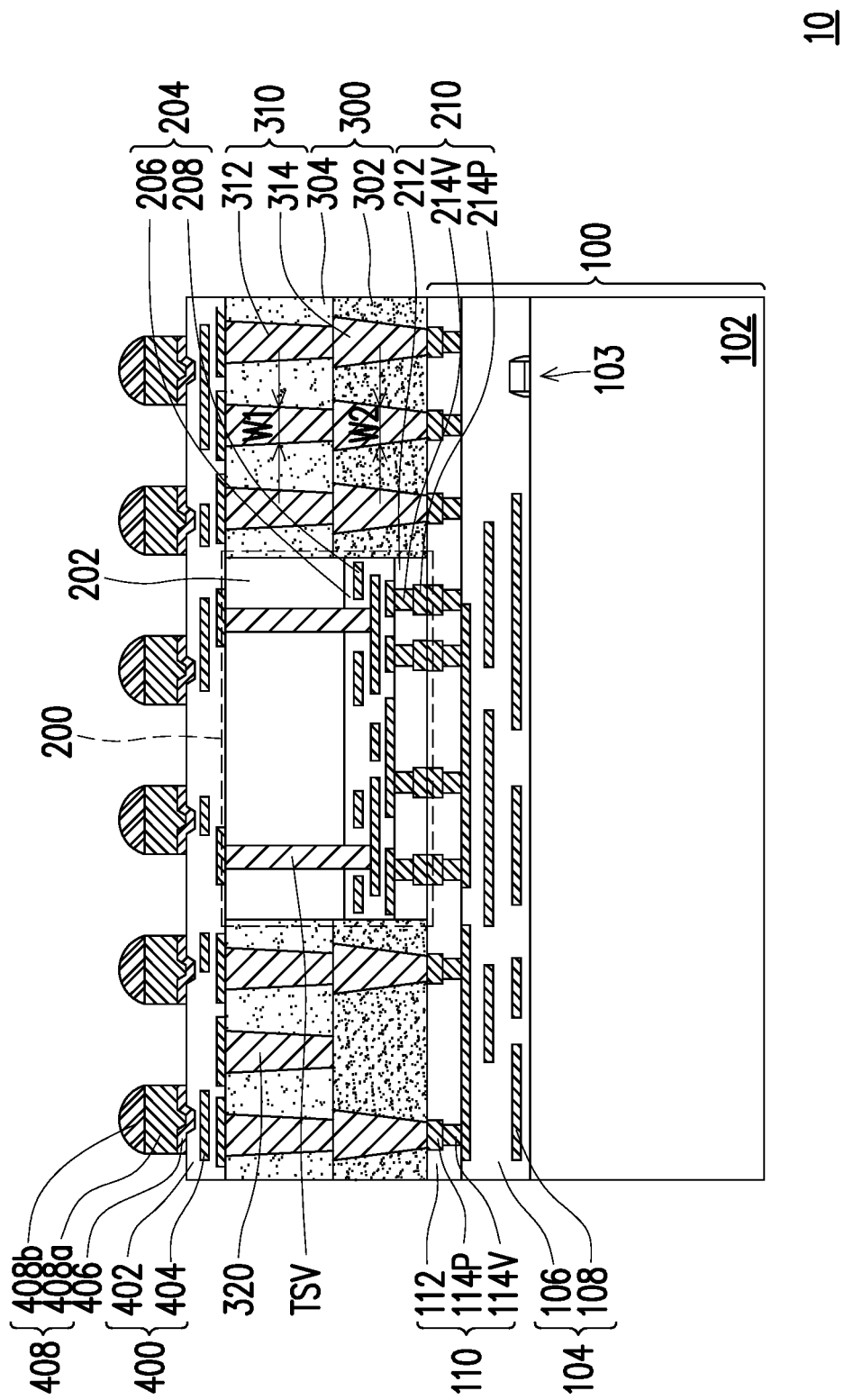
FIG. 13 is a cross-sectional view of a semiconductor package in accordance with some embodiments.

In the above embodiments, the second die 200 and the first die 100 are back-to-face bonded. However, the invention is not limited thereto. In some alternative embodiments, as shown in FIGS. 12 and 13, the second die 200 and the first die 100 are face-to-face bonded together by the first connecting structure 110 and the second connecting structure 210. In the embodiments of FIGS. 12 and 13, the first connecting structure 110 may be also referred to as a first bonding structure, the first dielectric layer 112 may be also referred to as a first bonding dielectric layer, the first vias 114V may be also referred to as first bonding vias, and the first pads 114P may be also referred to as first bonding pads. Similarly, the second connecting structure 210 may be also referred to as a second bonding structure, the second dielectric layer 212 may be also referred to as a second bonding dielectric layer, the second vias 214V may be also referred to as second bonding vias, and the second pads 214P may be also referred to as second bonding pads. In some embodiments, before the second die 200 is bonded to the first die 100, the second connecting structure 210 and the first connecting structure 110 are aligned, such that the second pads 214P are bonded to the first pads 114P and the second dielectric layer 212 is bonded to the first dielectric layer 112. In some embodiments, the alignment of the first connecting structure 110 and the second connecting structure 210 may be achieved by using an optical sensing method. After the alignment is achieved, the first connecting structure 110 and the second connecting structure 210 are bonded together by a hybrid bonding including a metal-to-metal bonding and a dielectric-to-dielectric bonding.

The structures of the FIGS. 12 and 13 are similar to the structures of FIGS. 1 and 2 respectively, and the main difference lies in the second die 200 of the FIGS. 12 and 13 further includes through substrate vias TSV that penetrate through the second semiconductor substrate 202. In some embodiments, the through substrate vias TSV are called "through silicon vias" when the second semiconductor substrate 202 is a silicon-containing substrate. The through substrate vias TSV are electrically connected to the second interconnect structure 204 and the redistribution layer structure 400. In some embodiments, the through substrate vias TSV include conductive vias. The conductive vias include copper, a copper alloy, aluminum, an aluminum alloy or a combination thereof. In some embodiments, each through substrate via TSV further includes a diffusion barrier layer between the conductive via and the second semiconductor substrate 202. The diffusion barrier layer includes Ta, TaN, Tl, TiN, CoW or a combination thereof.

FIG. 14A to FIG. 14E are cross-sectional views of respective intermediate structures during an example method of forming a semiconductor package in accordance with some embodiments. The semiconductor package formed by the method of FIG. 14A to FIG. 14E is similar to the semiconductor package of FIG. 1, hence the same reference numerals are used to refer to the same and liked parts, and its detailed description will be omitted herein. The difference is illustrated in details below.

Figure 14A:
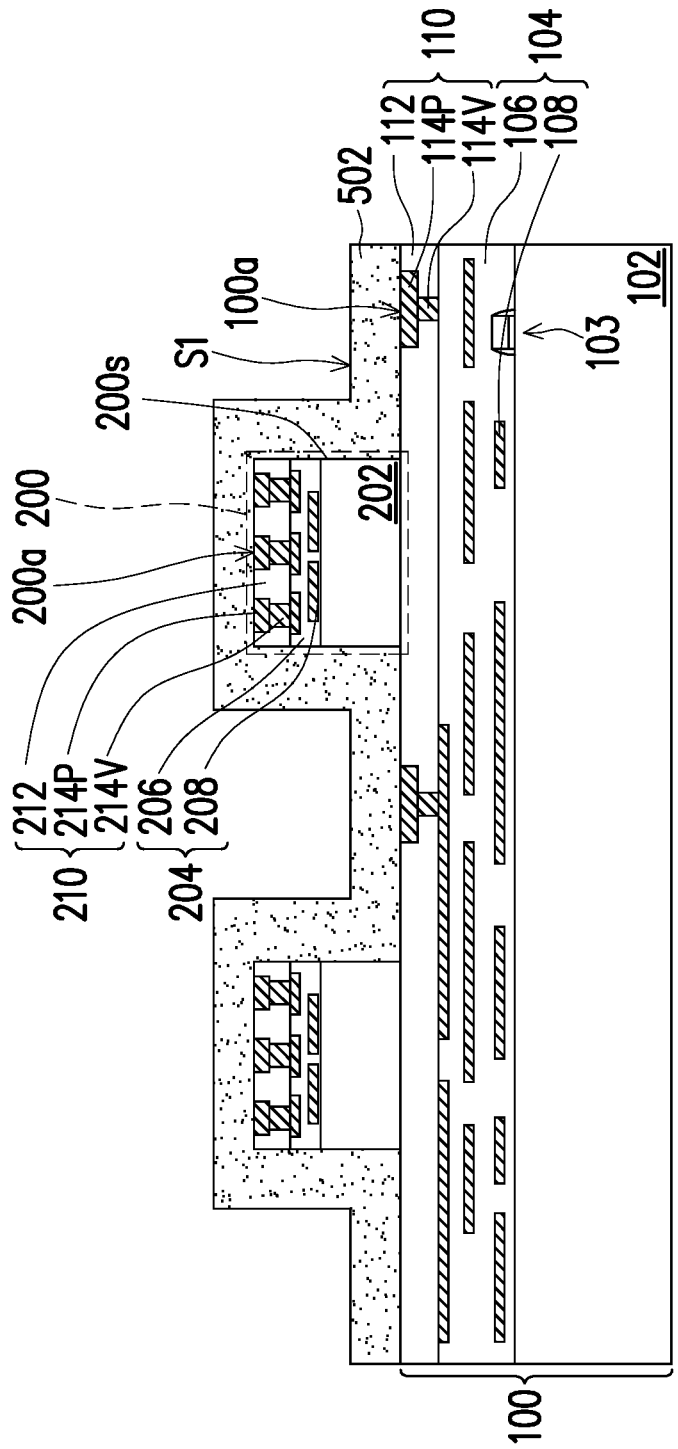
FIG. 14A to FIG. 14E are cross-sectional views of respective intermediate structures during an example method of forming a semiconductor package in accordance with some embodiments.

Referring to FIG. 14A, a first die 100 is provided, and a plurality of second dies 200 are bonded to the first die 100. Then, a dielectric layer 502 is formed over the first die 100 to cover the second dies 200. In some embodiments, the dielectric layer 502 is conformally formed on exposed surfaces of the second dies 200 and exposed surfaces of the first die 100 between the second dies 200. For example, the dielectric layer 502 covers top surfaces 200a and sidewalls 200s of the second dies 200 and a top surface 100a of the first die 100 between the second dies 200. In some embodiments, a top surface S1 of the dielectric layer 502 between the second dies 200 is lower than the top surfaces 200a of the second dies 200. In some embodiments, a material of the dielectric layer 502 includes silicon oxide, silicon oxynitride, silicon nitride or the like, and is formed by spin-coating, lamination, deposition or the like.

Figure 14B:
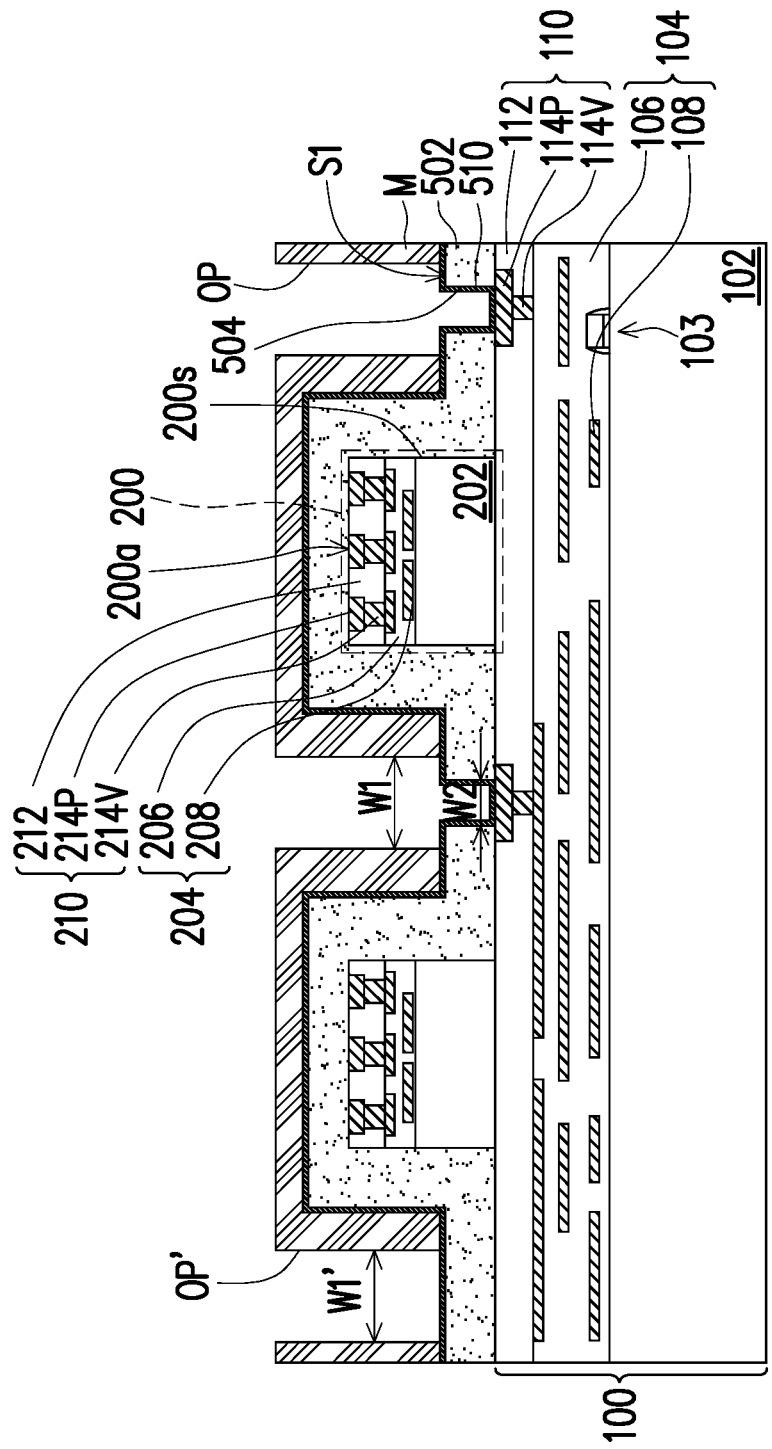

Referring to FIG. 14B, a plurality of openings 504 are formed in the dielectric layer 502 between the second dies 200. The openings 504 are formed corresponding to the first pads 114P of the first die 100, and the openings 504 expose portions of the first pads 114P respectively. Then, a seed layer 510 is formed over the dielectric layer 502 having the openings 504. In some embodiments, the seed layer 510 is conformally formed on the top surface S1 of the dielectric layer 502, sidewalls of the openings 504 and bottoms of the openings 504. The seed layer 510 includes a titanium/copper composite layer and is formed by a sputtering process, for example. After that, a mask M is formed over the seed layer 510. The mask M has a plurality of openings OP, OP'. The openings OP are disposed directly over the openings 504, and the opening OP' is disposed over aside the openings OP. The openings OP have a width W1 larger than a width W2 of the openings 504. Accordingly, the openings OP expose the openings 504 entirely, and the openings OP expose portions of the seed layer 510 on the openings 504. The opening OP' has a width W1', and the width W1' may be the same as or different from the width W1 of the openings OP. The opening OP' expose a portion of the seed layer 510 over the dielectric layer 502.

Figure 14C:
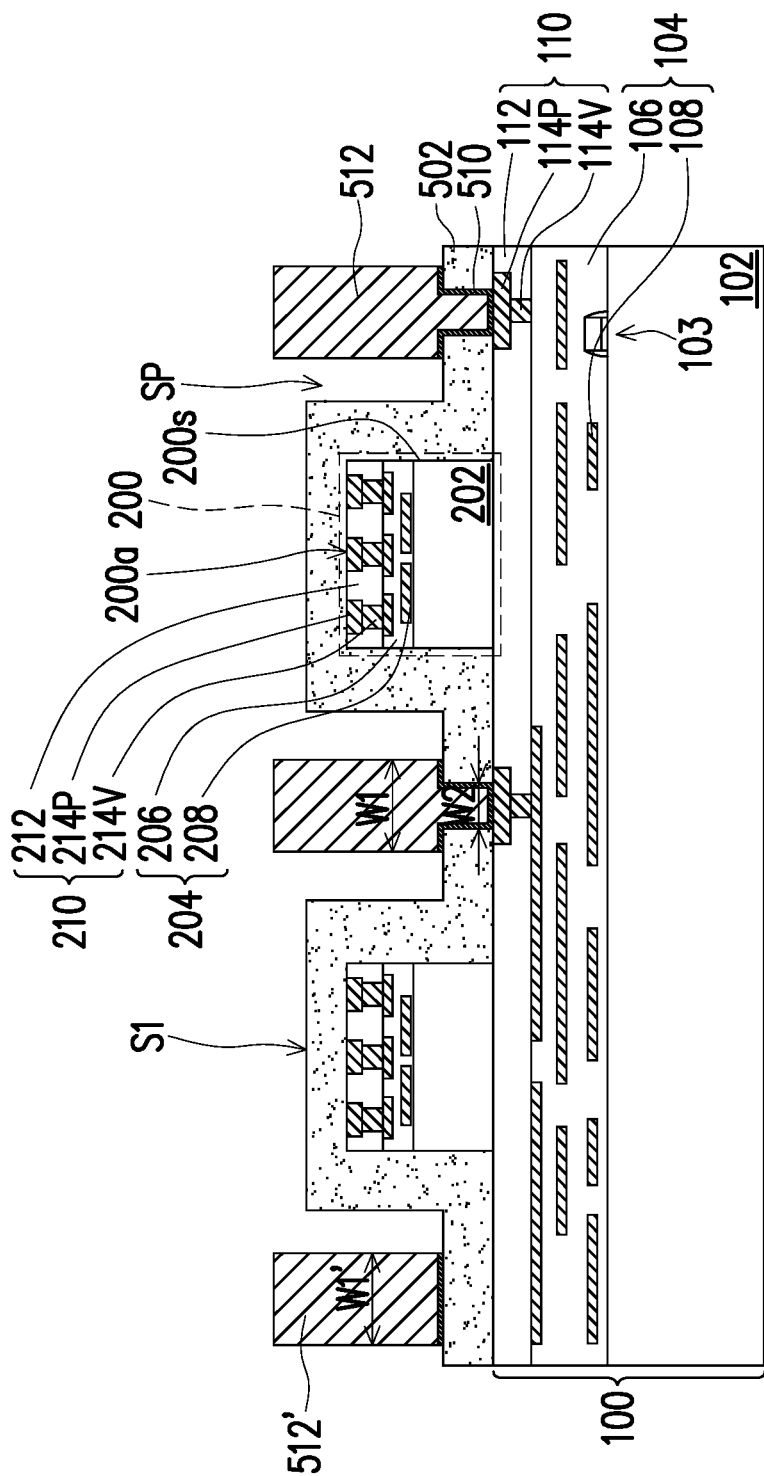

Referring to FIGS. 14B and 14C, a plurality of conductive layers 512 are formed to fill the openings OP and the openings 504, and a conductive layer 512' is formed to fill the opening OP'. For example, a plating process is performed to form the conductive layers 512, 512' on portions of the seed layer 510 exposed by the openings OP, OP'. A material of the conductive layer 512, 512' includes aluminum, titanium, copper, nickel, tungsten, and/or alloys thereof. In some embodiments, the conductive layers 512 are partially disposed in the openings 504 and partially protruding from the openings 504. Then, the mask M is removed by a stripping process, and the exposed seed layer 510 is removed by an etching process. In some embodiments, after removing the mask M, a spacing SP is formed between a portion of the dielectric layer 502 on the sidewall 200s of the second die 200 and a portion of the conductive layer 512, 512' protruding from the dielectric layer 502.

Figure 14D:
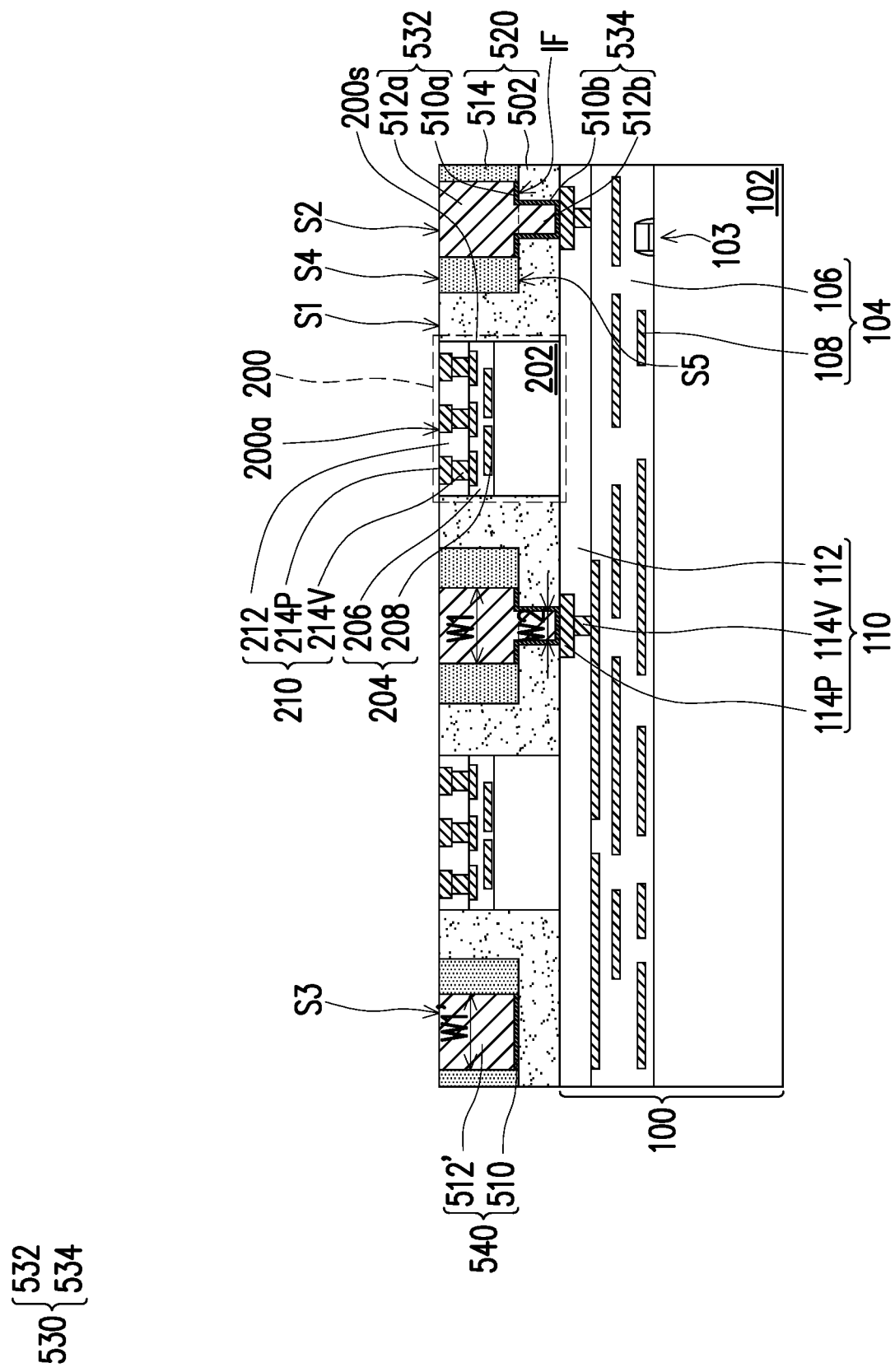

Referring to FIG. 14D, a dielectric layer 514 is formed to fill the spacings SP. Then, a plurality of through vias 530 are formed in the dielectric layer 514 and the dielectric layer 502, and a via 540 is formed in the dielectric layer 514. For example, a material layer of the dielectric layer 514 is formed over the first die 100 to cover the dielectric layer 502 and the conductive layers 512, 512'. Then, the material layer of the dielectric layer 514 is planarized until the second dies 200 are exposed. In some embodiments, the conductive layers 512, 512' and the dielectric layer 502 are also subjected to the planarization process. For example, the material layer of the dielectric layer 514, the conductive layers 512, 512' and the dielectric layer 502 are planarized until the second dies 200 are exposed. Then, the dielectric layer 514, the through vias 530 and the via 540 are formed. In some embodiments, the top surfaces 200a of the second dies 200, the top surface S1 of the dielectric layer 502, top surfaces S2 of the through vias 530, a top surface S3 of the via 540 and a top surface S4 of the dielectric layer 514 are substantially coplanar. In some embodiments, the planarization process includes a mechanical grinding process and/or a chemical mechanical polishing (CMP) process. However, the disclosure is not limited thereto. In some alternative embodiments, an etching process or a fly cutting process may be adapted to performing the planarization process.

In some embodiments, the dielectric layer 502 encapsulates the dielectric layer 514, and the dielectric layer 502 and the dielectric layer 514 form a dielectric encapsulation 520. The dielectric encapsulation 520 encapsulates the second dies 200. In some embodiments, a material of the dielectric layer 514 is different from the dielectric layer 502. However, in some alternative embodiments, a material of the dielectric layer 514 is the same as the dielectric layer 502. In some embodiments, the dielectric layer 514 includes polyimide, benzocyclobutene (BCB), polybenzooxazole (PBO), or any other suitable polymer-based dielectric material. The dielectric layer 514, for example, may be formed by suitable fabrication techniques such as spin-on coating, chemical vapor deposition (CVD), plasma-enhanced chemical vapor deposition (PECVD), or the like. In some embodiments, a material of the dielectric layer 514 includes a molding compound, a molding underfill, a resin (such as epoxy), a combination thereof or the like. The dielectric layer 514 may be formed by a molding process.

In some embodiments, the through vias 530 is encapsulated by the dielectric encapsulation 520, and the through vias 530 penetrates the dielectric encapsulation 520 to electrically connect the first pads 114P of the first die 100. In some embodiments, the through via 530 includes a first portion 532 and a second portion 534. The second portion 534 is disposed between and electrically connected to the first die 100 and the first portion 532. The first portion 532 is encapsulated by the dielectric layer 514, and the second portion 534 is encapsulated by the dielectric layer 502. In some embodiments, the top surface S4 of the dielectric layer 514 is substantially coplanar with the top surface S2 of the through via 530, and a bottom surface S5 (i.e., opposite to the top surface S4) of the dielectric layer 514 is substantially levelled with an interface IF between the first portion 532 and the second portion 534. In some embodiments, the first portion 532 includes a seed layer 510a (i.e., a portion of the seed layer 510) and a conductive layer 512a (i.e., a portion of the conductive layer 512). The seed layer 510a is disposed beneath an edge portion of a bottom surface of the conductive layer 512a. The second portion 534 includes a seed layer 510b (i.e., a portion of the seed layer 510) and a conductive layer 512b (i.e., a portion of the conductive layer 512). The seed layer 510b surrounds a sidewall and a bottom surface of the conductive layer 512b. In some embodiments, the seed layer 510a is integrally formed with the seed layer 510b, and the conductive layer 512a is integrally formed with the conductive layer 512b. The seed layer 510a is disposed aside an interface IF between the conductive layer 512a and the conductive layer 512b. The seed layer 510b is disposed between the conductive layer 512b and the dielectric encapsulation 520 and between the conductive layer 512b and the first die 100.

In some embodiments, the first portion 532 of the through via 530 is disposed in the dielectric layer 502, and the second portion 534 of the through via 530 is protruding from the dielectric layer 502. In some embodiments, the first portion 532 has a first width W1, and the second portion 534 has a second width W2 different from the first width W1. In some embodiments, the first width W1 is larger than the second width W2. However, the invention is not limited thereto. In some alternative embodiments, the first width W1 is smaller than the second width W2.

In some embodiments, the via 540 penetrates the dielectric layer 514. In some embodiments, the via 540 includes the seed layer 510 and the conductive layer 512'. The conductive layer 512' is disposed on the seed layer 510, and a sidewall of the conductive layer 512' is substantially flush with a sidewall of the seed layer 510. In some embodiments, the seed layer 510 of the via 540 and the seed layers 510a, 510b of the through via 530 are simultaneously formed, and the conductive layer 512' of the via 540 and the conductive layers 512a, 512b of the through via 530 are simultaneously formed. In other words, the via 540 and the through vias 530 are formed by the same process. In some embodiments, the via 540 has a width W1'. The width W1' may be the same as or different from the first width W1 of the first portion 532.

Figure 14E:
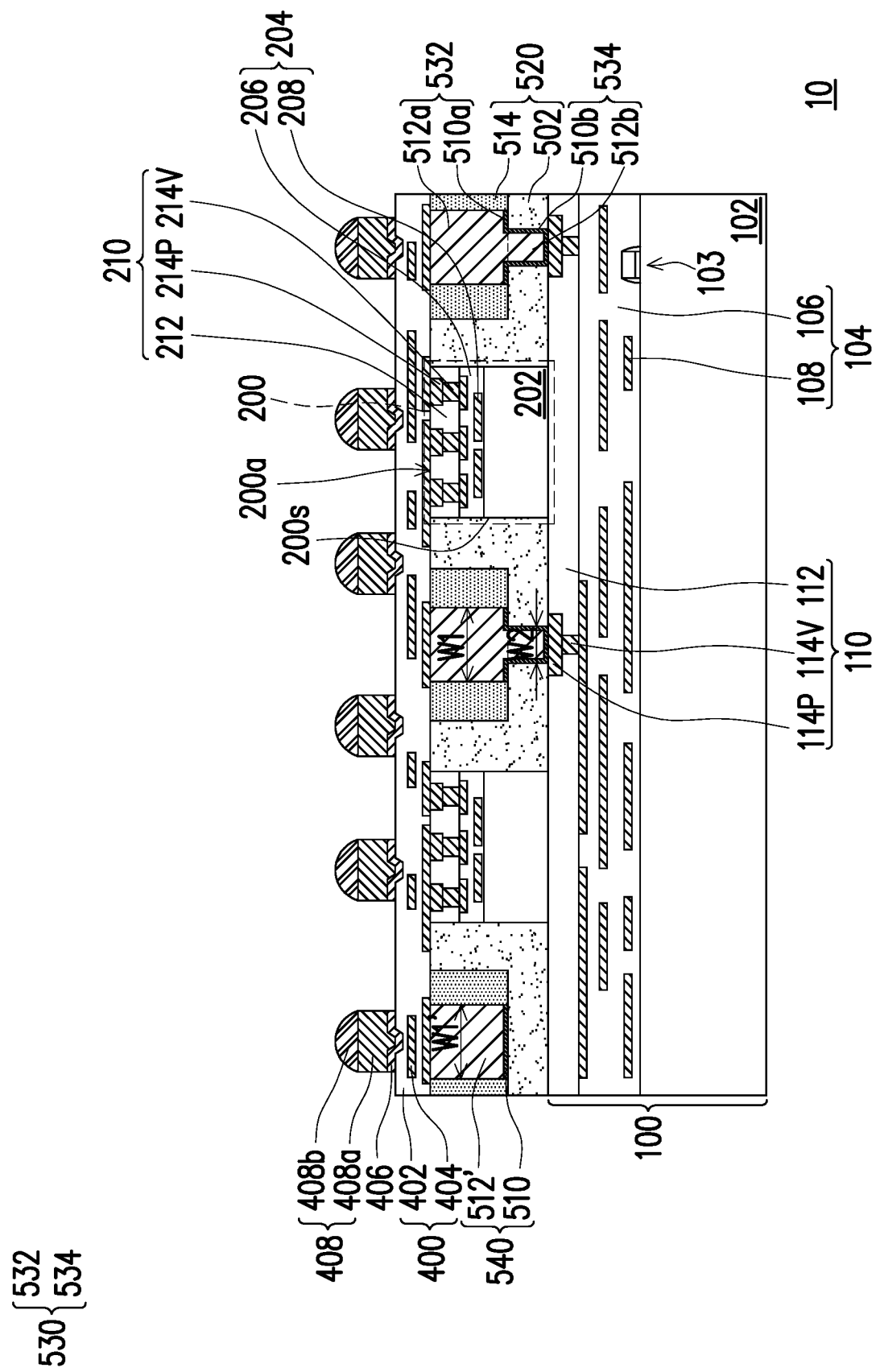

Referring to FIG. 14E, a redistribution layer structure 400 is formed over the second die 200, the through vias 530, the via 540 and the dielectric encapsulation 520. The redistribution layer structure 400 includes at least one dielectric layer 402 and at least one conductive layer 404 stacked alternately. In some embodiments, a portion of the redistribution layer structure 400 is electrically connected to the second interconnect structure 204 of the second die 200, and another portion of the redistribution layer structure 400 is electrically connected to the through vias 530. In addition, in some embodiments, a portion of the redistribution layer structure 400 is electrically connected to the via 540. The redistribution layer structure 400 may be similar to the redistribution layer structure 400 as described for FIG. 1, so the detailed description thereof is omitted herein. Then, a plurality of pads 406 are formed over the redistribution layer structure 400, and a plurality of terminal connectors 408 are formed to electrically connect the pads 406. The pads 406 and the terminal connectors 408 may be similar to the pads 406 and the terminal connectors 408 as described for FIG. 1, so the detailed description thereof is omitted herein. After the terminal connectors 408 is formed, a semiconductor package 10 of the application is thus completed.

FIG. 15A to FIG. 15F are cross-sectional views of respective intermediate structures during an example method of forming a semiconductor package in accordance with some embodiments. The method of FIGS. 15A to 15F is similar to the method of FIGS. 14A to 14E, hence the same reference numerals are used to refer to the same and liked parts, and its detailed description will be omitted herein. The difference is illustrated in details below.

Figure 15A:
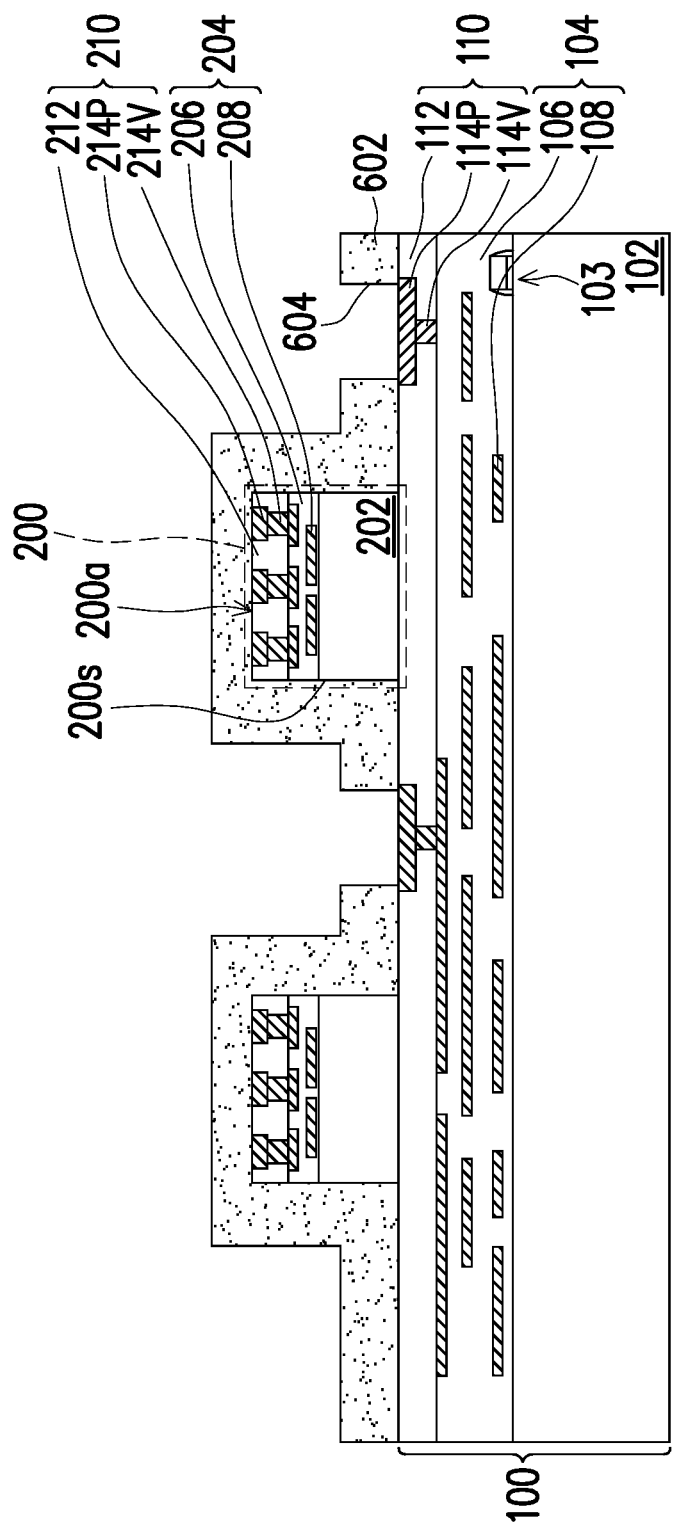
FIG. 15A to FIG. 15F are cross-sectional views of respective intermediate structures during an example method of forming a semiconductor package in accordance with some embodiments.

Referring to FIG. 15A, a first die 100 is provided, and a plurality of second dies 200 are bonded to the first die 100. Then, a dielectric layer 602 is formed over the first die 100 to cover the second dies 200. In some embodiments, a top surface S1 of the dielectric layer 602 between the second dies 200 is lower than top surfaces 200a of the second dies 200. After that, a plurality of openings 604 are formed in the dielectric layer 602. The openings 604 are formed corresponding to the first pads 114P of the first die 100, and the openings 604 expose portions of the first pads 114P respectively. The dielectric layer 602 and the openings 604 may be similar to the dielectric layer 502 and the openings 504 as described for FIGS. 14A and 14B, so the detailed description thereof is omitted herein.

Figure 15B:
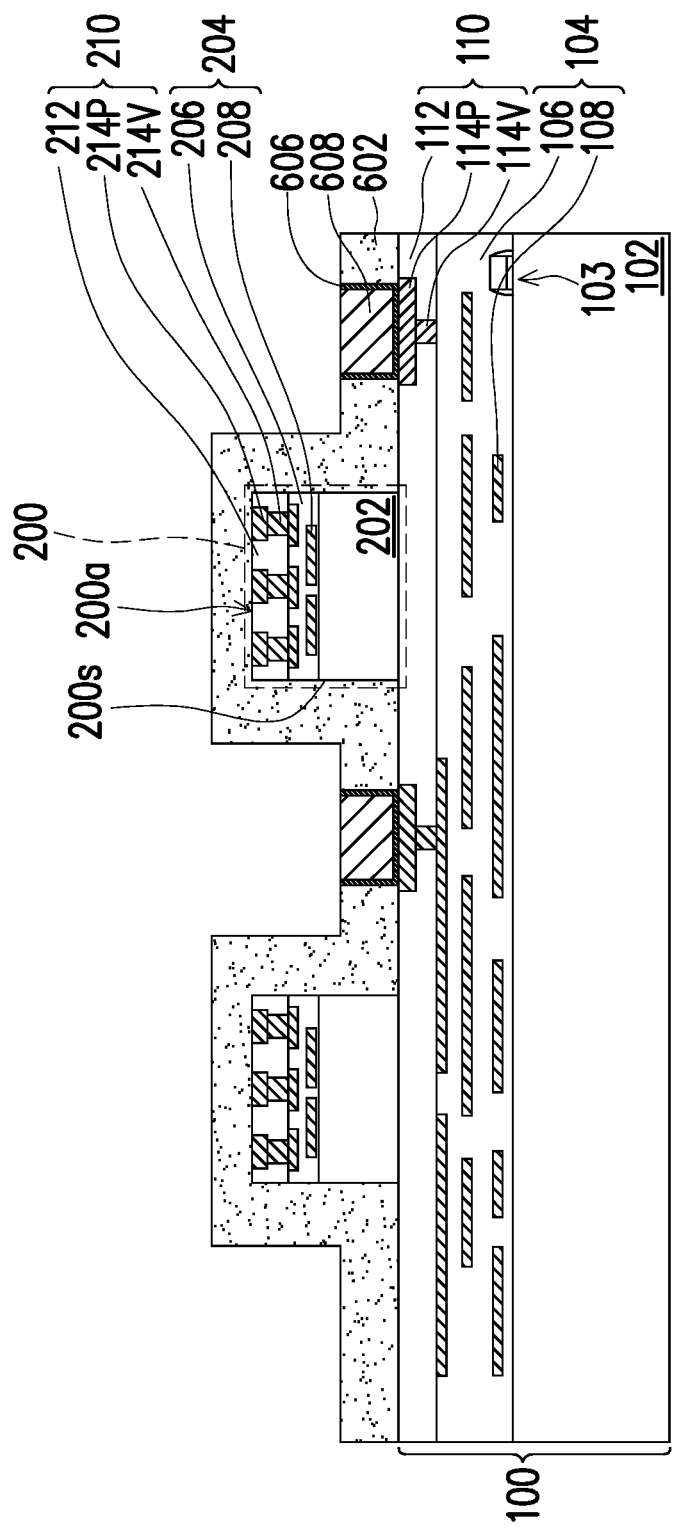

Referring to FIG. 15B, seed layers 606 are respectively formed on sidewalls and bottom surfaces of the openings 604, and conductive layers 608 are respectively formed to fill the openings 604. In some embodiments, top surfaces of the seed layers 606 and the conductive layers 608 are substantially coplanar with the top surface S1 of the dielectric layer 602 between the second dies 200. In some embodiments, the seed layer 606 includes a titanium/copper composite layer, and the seed layer 606 is formed by a sputtering process. In some embodiments, the conductive layer 608 may includes aluminum, titanium, copper, nickel, tungsten, and/or alloys thereof, and the conductive layer 608 is formed by a sputtering process.

Figure 15C:
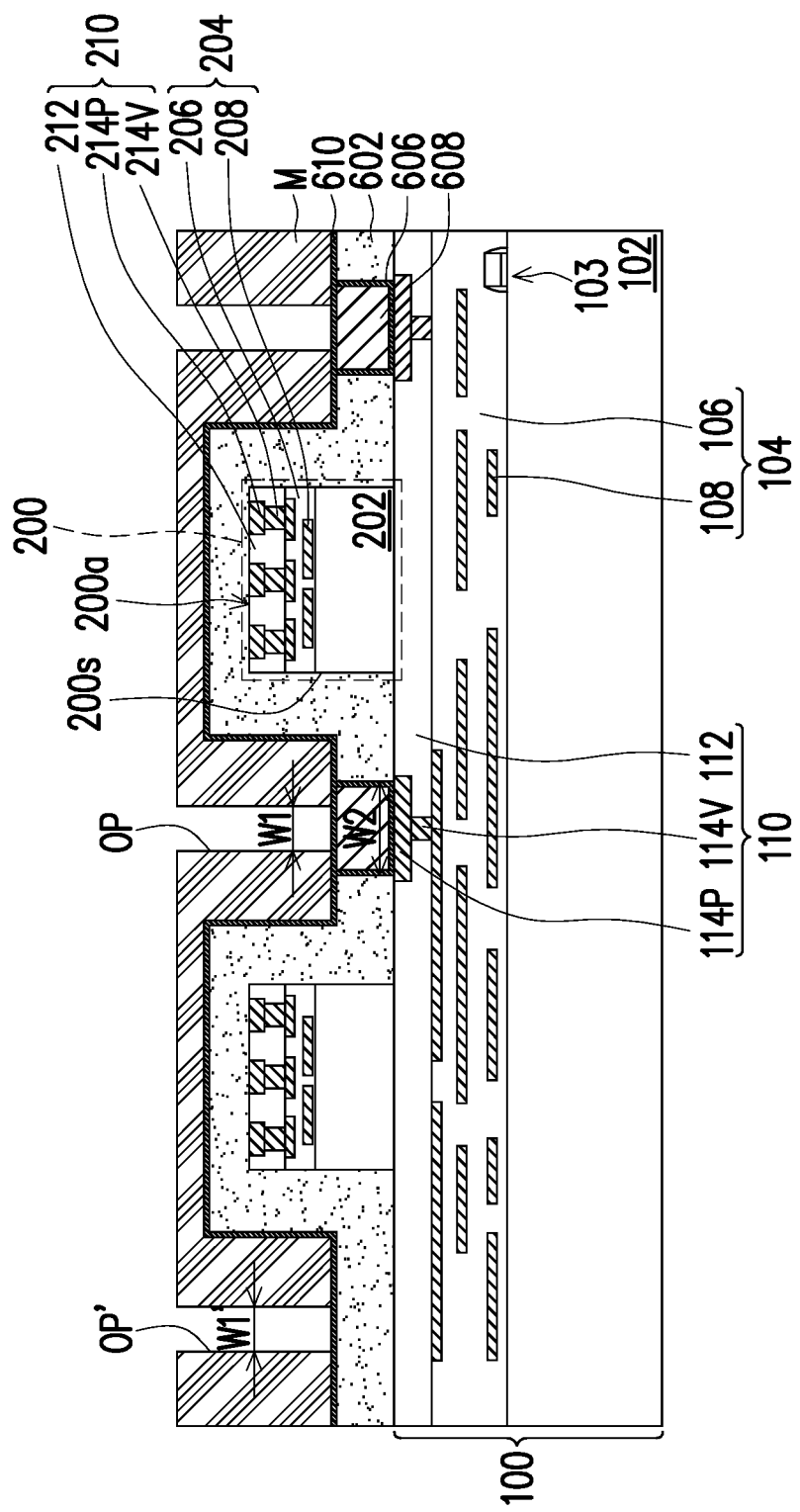

Referring to FIG. 15C, a seed layer 610 is formed over the dielectric layer 602, the conductive layers 608 and the seed layers 606. In some embodiments, the seed layer 610 is conformally formed on the dielectric layer 602, the conductive layers 608 and the seed layers 606. The seed layer 610 includes a titanium/copper composite layer and is formed by a sputtering process, for example. After that, a mask M is formed over the seed layer 610. The mask M has a plurality of openings OP, OP'. The openings OP are disposed directly over the conductive layers 608, and the opening OP' is disposed over aside the openings OP. In some embodiments, a width W1 of the openings OP is smaller than a total width W2 of the conductive layers 608 and the seed layers 606. Thus, the openings OP expose portions of the seed layer 610 over the conductive layers 608. The opening OP' has a width W1', and the width W1' may be the same as or different from the width W1 of the openings OP. The opening OP' expose a portion of the seed layer 610 over the dielectric layer 602.

Figure 15D:
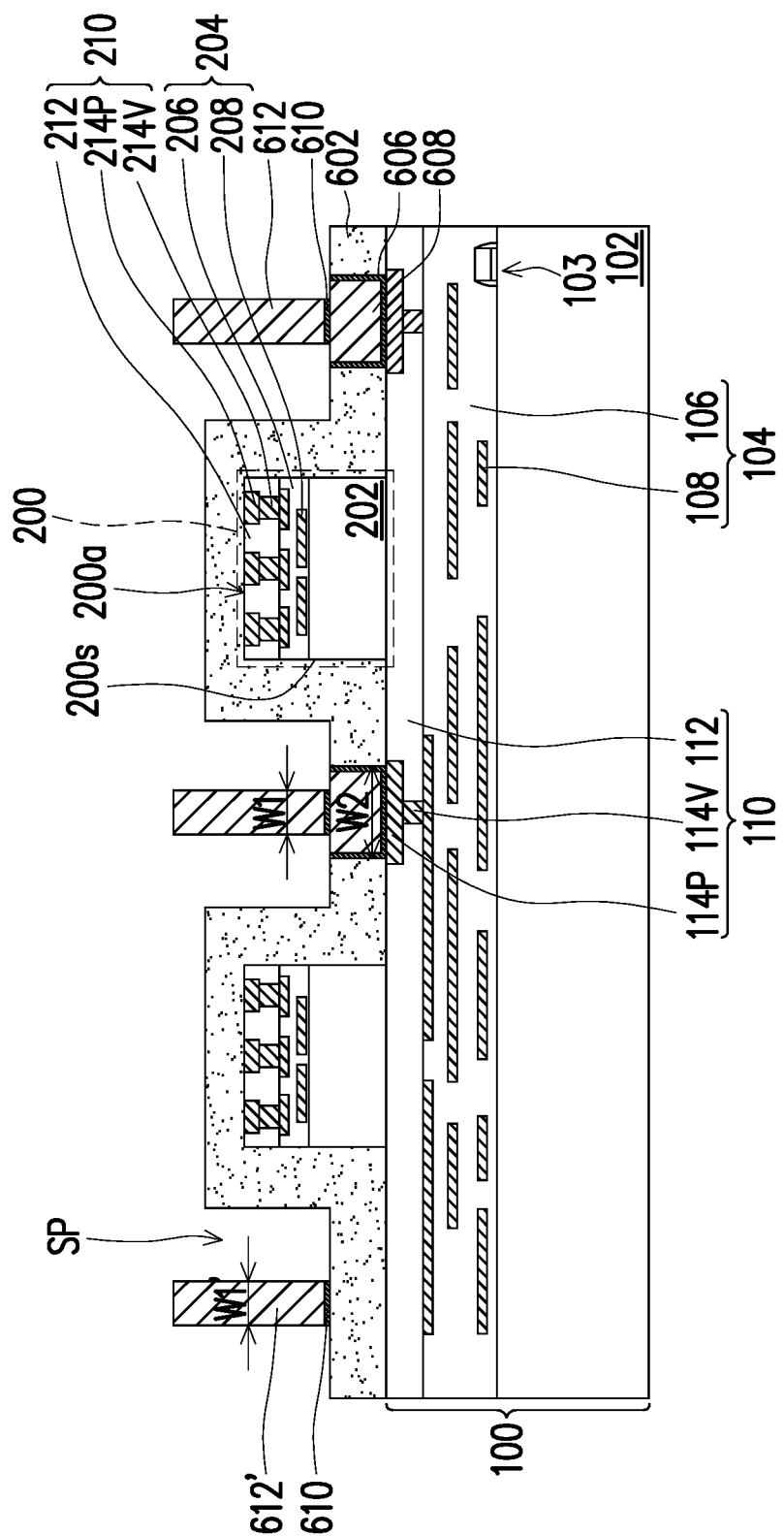

Referring to FIGS. 15C and 15D, a plurality of conductive layers 612 are formed on the seed layer 610 in the openings OP, and a conductive layer 612' is formed to fill the opening OP'. For example, a plating process is performed to form the conductive layers 612, 612' on the seed layer 610 exposed by the openings OP, OP'. A material of the conductive layer 612, 612' includes aluminum, titanium, copper, nickel, tungsten, and/or alloys thereof. Then, the mask M is removed by a stripping process, and the exposed seed layer 510 is removed by an etching process. In some embodiments, after removing the mask M, a spacing SP is formed between a portion of the dielectric layer 602 on the sidewall 200s of the second die 200 and the conductive layer 612, 612'.

Figure 15E:
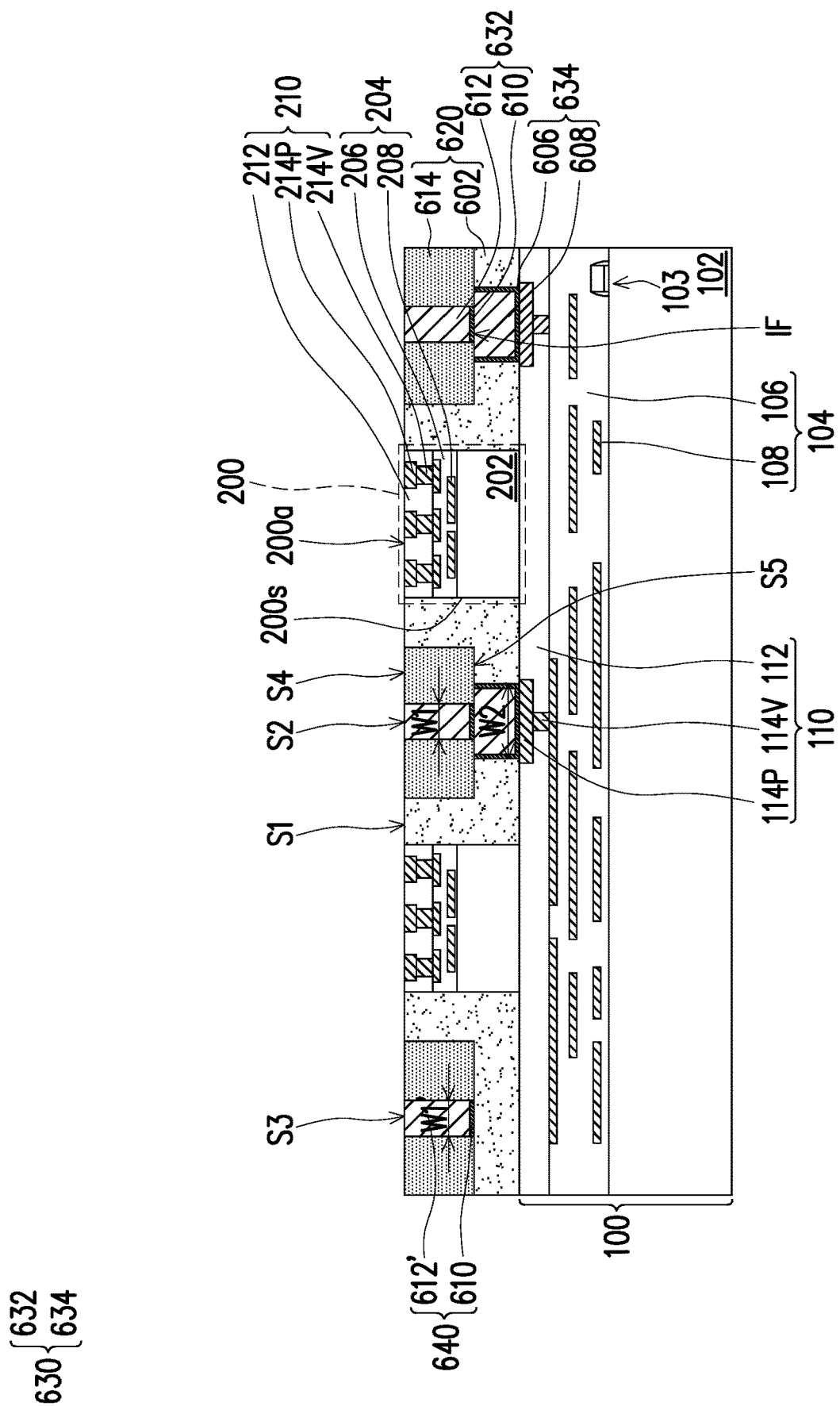

Referring to FIGS. 15E, a dielectric layer 614 is formed to fill the spacings SP. Then, a plurality of through vias 630 are formed in the dielectric layer 614 and the dielectric layer 602, and a via 640 is formed in the dielectric layer 514. For example, a material layer of the dielectric layer 614 is formed over the first die 100 to cover the dielectric layer 602 and the conductive layers 612, 612'. Then, the material layer of the dielectric layer 614 is planarized until the second dies 200 are exposed. In some embodiments, the conductive layers 612, 612' and the dielectric layer 602 are also subjected to the planarization process. For example, the material layer of the dielectric layer 614, the conductive layers 612 and the dielectric layer 602 are planarized until the second dies 200 are exposed. Then, the dielectric layer 614, the through vias 630 and the via 640 are formed. In some embodiments, the top surfaces 200a of the second dies 200, the top surface S1 of the dielectric layer 602, top surfaces S2 of the through vias 630, a top surface S3 of the via 640 and a top surface S4 of the dielectric layer 614 are substantially coplanar. In some embodiments, the planarization process includes a mechanical grinding process and/or a chemical mechanical polishing (CMP) process. However, the disclosure is not limited thereto. In some alternative embodiments, an etching process or a fly cutting process may be adapted to performing the planarization process.

In some embodiments, the dielectric layer 602 encapsulates the dielectric layer 614, and the dielectric layer 602 and the dielectric layer 614 form a dielectric encapsulation 620. The dielectric encapsulation 620 encapsulates the second dies 200. In some embodiments, a material of the dielectric layer 614 is different from the dielectric layer 602. However, in some alternative embodiments, a material of the dielectric layer 614 is the same as the dielectric layer 602. In some embodiments, the dielectric layer 614 includes polyimide, benzocyclobutene (BCB), polybenzooxazole (PBO), or any other suitable polymer-based dielectric material. The dielectric layer 614, for example, may be formed by suitable fabrication techniques such as spin-on coating, chemical vapor deposition (CVD), plasma-enhanced chemical vapor deposition (PECVD), or the like. In some embodiments, a material of the dielectric layer 614 includes a molding compound, a molding underfill, a resin (such as epoxy), a combination thereof or the like. The dielectric layer 614 may be formed by a molding process.

In some embodiments, the through vias 630 is encapsulated by the dielectric encapsulation 620, and the through vias 630 penetrates the dielectric encapsulation 620 to electrically connect the first pads 114P of the first die 100. In some embodiments, the through via 630 includes a first portion 632 and a second portion 634. The second portion 634 is disposed between and electrically connected to the first die 100 and the first portion 632. The first portion 632 is encapsulated by the dielectric layer 614, and the second portion 634 is encapsulated by the dielectric layer 602. In some embodiments, the top surface S4 of the dielectric layer 614 is substantially coplanar with the top surface S2 of the through via 630, and a bottom surface S5 (i.e., opposite to the top surface S4) of the dielectric layer 614 is substantially levelled with an interface IF between the first portion 632 and the second portion 634. In some embodiments, the first portion 632 includes the seed layer 610 and the conductive layer 612. The seed layer 610 is entirely disposed beneath a bottom surface of the conductive layer 612. The second portion 632 includes the seed layer 606 and the conductive layer 608. The seed layer 606 surrounds a sidewall and a bottom surface of the conductive layer 608. In some embodiments, the seed layer 610 and the seed layer 606 are separately formed, and the conductive layer 612 and the conductive layer 608 are separately formed. In some embodiments, the seed layer 610 is physically separated from the seed layer 606. The seed layer 610 is disposed at an interface IF between the conductive layer 612 and the conductive layer 608. The seed layer 606 is disposed between the conductive layer 608 and the dielectric encapsulation 620 and between the conductive layer 608 and the first die 100.

In some embodiments, the first portion 632 of the through via 630 is disposed in the dielectric layer 602, and the second portion 634 of the through via 630 is protruding from the dielectric layer 602. In some embodiments, the first portion 632 has a first width W1, and the second portion 634 has a second width W2 different from the first width W1. In some embodiments, the first width W1 is smaller than the second width W2.

In some embodiments, the via 640 penetrates the dielectric layer 614. In some embodiments, the via 640 includes the seed layer 610 and the conductive layer 612'. The conductive layer 612' is disposed on the seed layer 610, and a sidewall of the conductive layer 612' is substantially flush with a sidewall of the seed layer 610. In some embodiments, the seed layer 610 of the via 640 and the seed layers 610 of the through via 630 are simultaneously formed, and the conductive layer 612' of the via 640 and the conductive layer 612 of the through via 630 are simultaneously formed. In other words, the via 640 and the first portion 632 of the through vias 630 are formed by the same process. In some embodiments, the via 640 has a width W1'. The width W1' may be the same as or different from the first width W1 of the first portion 632.

Figure 15F:
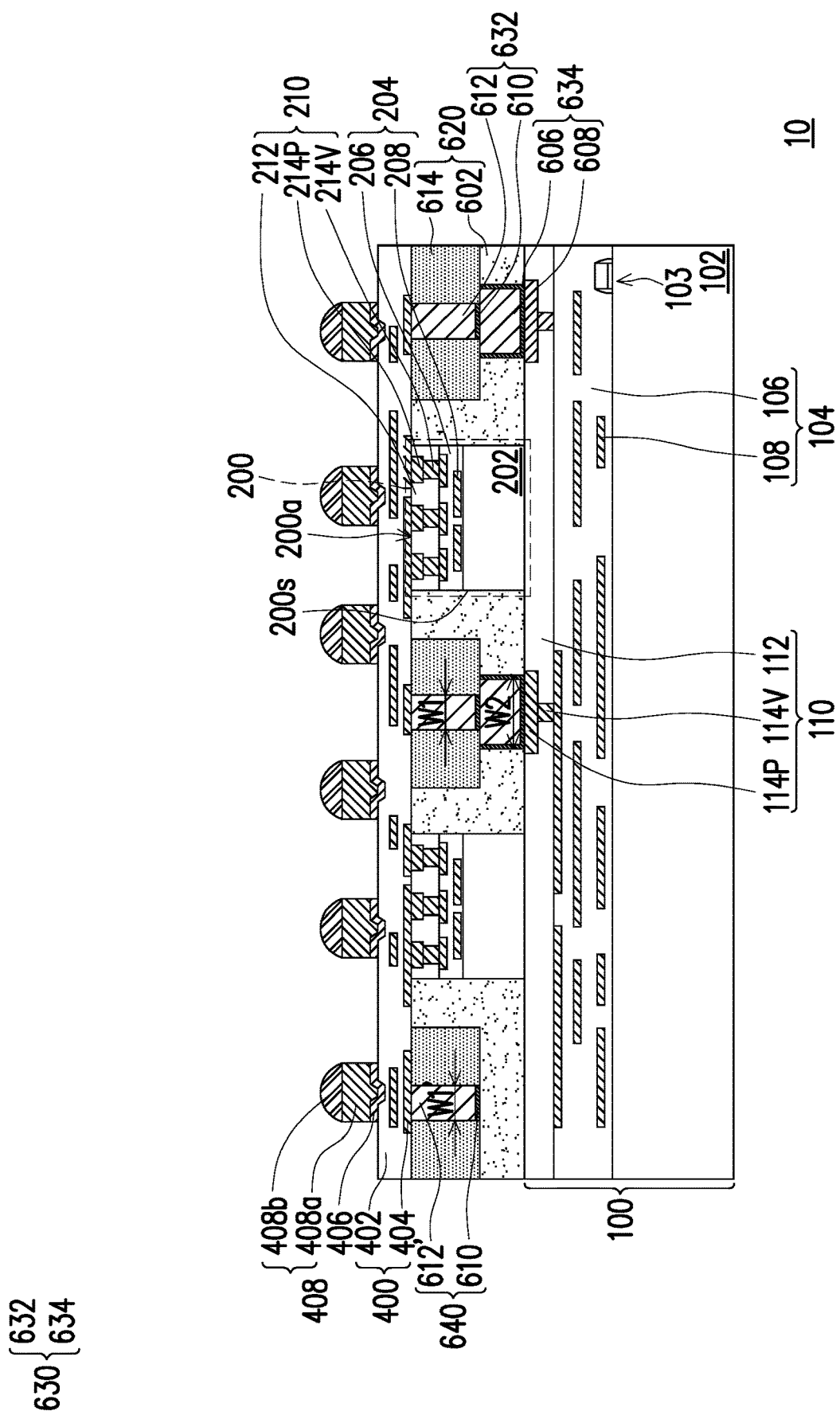

Referring to FIG. 15F, a redistribution layer structure 400 is formed over the second die 200, the through vias 630, the via 640 and the dielectric encapsulation 620. The redistribution layer structure 400 includes at least one dielectric layer 402 and at least one conductive layer 404 stacked alternately. In some embodiments, a portion of the redistribution layer structure 400 is electrically connected to the second interconnect structure 204 of the second die 200, and another portion of the redistribution layer structure 400 is electrically connected to the through vias 630. In addition, in some embodiments, a portion of the redistribution layer structure 400 is electrically connected to the via 640. The redistribution layer structure 400 may be similar to the redistribution layer structure 400 as described for FIG. 1, so the detailed description thereof is omitted herein. Then, a plurality of pads 406 are formed over the redistribution layer structure 400, and a plurality of terminal connectors 408 are formed to electrically connect the pads 406. The pads 406 and the terminal connectors 408 may be similar to the pads 406 and the terminal connectors 408 as described for FIG. 1, so the detailed description thereof is omitted herein. After the terminal connectors 408 is formed, a semiconductor package 10 of the application is thus completed.

Figure 16:
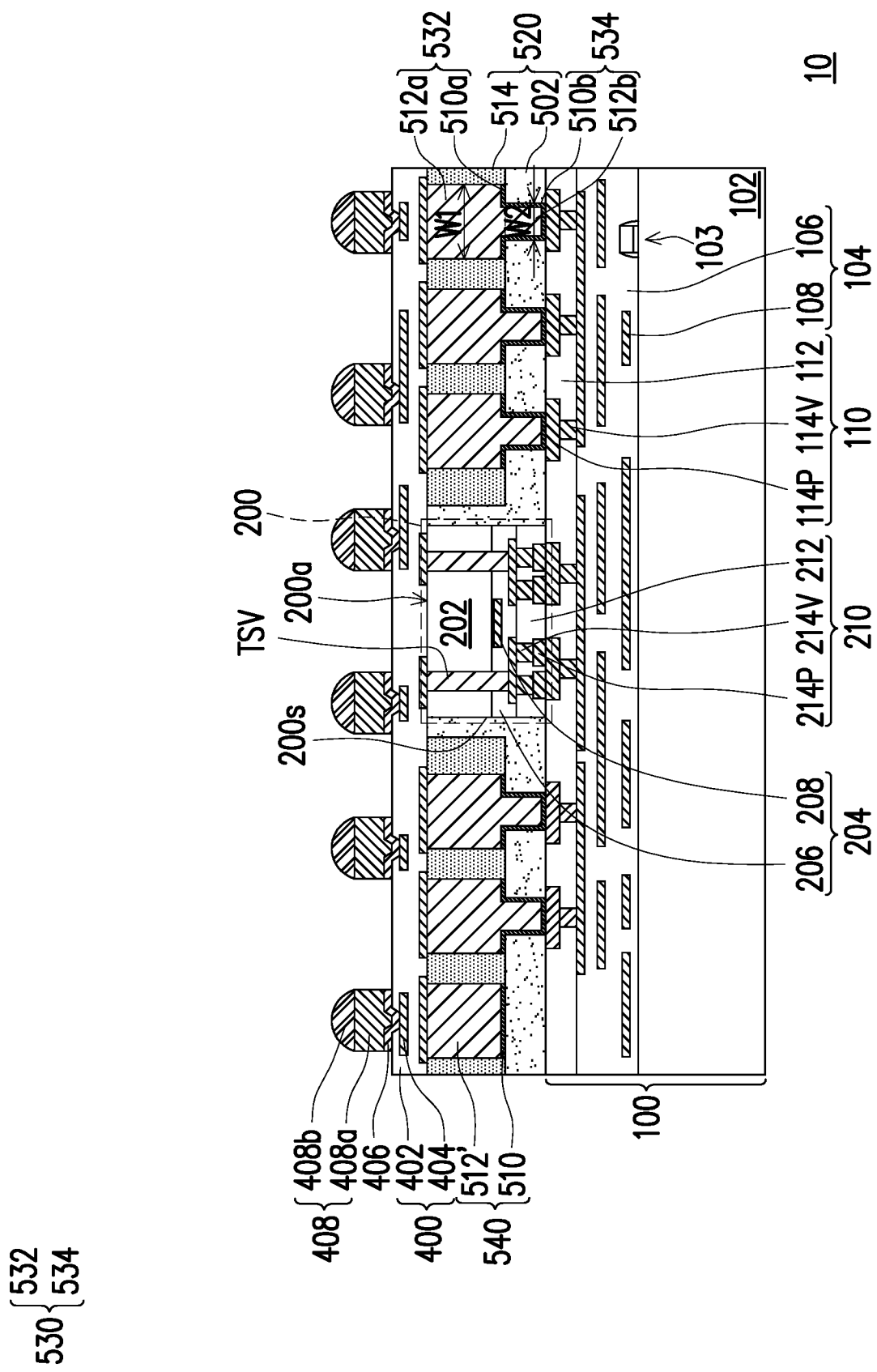
FIG. 16 is a cross-sectional view of a semiconductor package in accordance with some embodiments.
Figure 17:
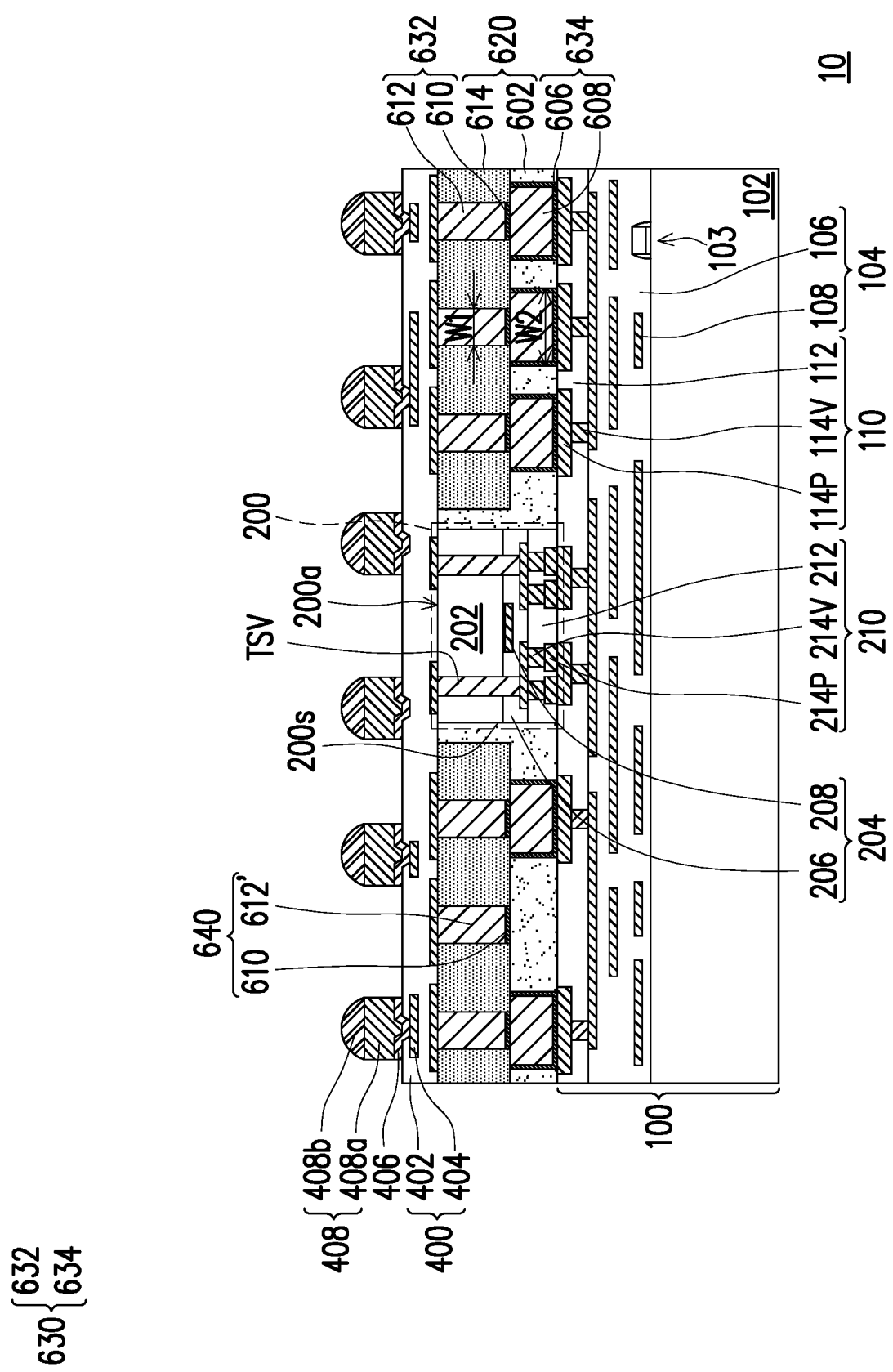
FIG. 17 is a cross-sectional view of a semiconductor package in accordance with some embodiments.

In the embodiments of FIGS. 14E and 15F, each dielectric layer 514, 614 encapsulates one through via 530, 630 or via 540, 640. However, the invention is not limited thereto. In some alternative embodiments, as shown in FIGS. 16 and 17, the dielectric layer 514, 614 encapsulates at least two of through vias 530, 630 and via 540, 640. In some embodiments, the second die 200 may be similar to the second die 200 as described for FIGS. 12 and 13, so the detailed description thereof is omitted herein.

In view of the above, in the semiconductor package, the through via includes a plurality of portions having different widths, and thus the through via has a step-shaped sidewall. The portions of the through via may be integrally formed or separately formed. In addition, the different portions of the through via may be encapsulated by the same material or respectively encapsulated by different materials. In other words, the dielectric encapsulation used to fill the gaps between the dies and encapsulate the dies and the through vias may include the same material (i.e., homogeneous material) or different materials (i.e., heterogeneous material). Furthermore, at least one via may be simultaneously formed with the through via in the dielectric encapsulation, and the via may provide additional routing layer according to the design.

In accordance with some embodiments of the present disclosure, a semiconductor package includes a first die, a second die, a through via and a dielectric encapsulation. The second die is bonded to the first die. The through via is disposed aside the second die and electrically connected to the first die. The through via includes a step-shaped sidewall. The dielectric encapsulation encapsulates the second die and the through via.

In accordance with alternative embodiments of the present disclosure, a semiconductor package includes a first die, a plurality of second dies, a through via, a first dielectric layer and a second dielectric layer. The second dies are bonded to the first die. The through via is disposed between the second dies and electrically connected to the first die. The through via includes a first portion and a second portion between the first portion and the first die. The first dielectric layer encapsulates the first portion. The second dielectric layer is different from the first dielectric layer, and encapsulates the second dies, the second portion of the through via and the first dielectric layer.

In accordance with yet alternative embodiments of the present disclosure, a method of forming a semiconductor package includes the following steps. A first die and a plurality of second dies bonded to the first die are provided. A first dielectric layer is formed over the first die to cover the plurality of second dies. A first opening is formed in the first dielectric layer between the second dies. A through via is formed. The through via is partially disposed in the first opening and partially protruding from the first opening. A first portion of the through via protruding from the first opening has a first width, and a second portion of the through via in the first opening has a second width different from the first width. A second dielectric layer is formed between the through via and the first dielectric layer on a sidewall of the second die.

In accordance with yet alternative embodiments of the present disclosure, a semiconductor package includes a first die, a plurality of second dies and a through via. The second dies are disposed over and electrically connected to the first die. The through via is disposed between the second dies and electrically connected to the first die. The through via includes a first portion having a first width and a second portion having a second width different from the first width and disposed between the first portion and the first die. The first portion includes a first seed layer and a first conductive layer, and the first seed layer is disposed aside an interface between the first portion and the second portion.

In accordance with yet alternative embodiments of the present disclosure, a semiconductor package includes a first die, a second die, a plurality of first vias, a plurality of second vias and an encapsulant. The second die is disposed over and electrically connected to the first die. The first vias and the second vias are alternately disposed aside the second die, wherein the first vias are electrically isolated from the second vias. The encapsulant encapsulates the second die, the first vias and the second vias.

In accordance with yet alternative embodiments of the present disclosure, a semiconductor package includes a first die, a second die, a first via, a first dielectric layer and a second dielectric layer. The second die is disposed over and electrically connected to the first die. The first via is disposed aside the second die, electrically connected to the first die. The first dielectric layer encapsulates the first via. The second dielectric layer is different from the first dielectric layer and encapsulates the second die and the first dielectric layer. Bottom surfaces of the first via and the first dielectric layer are substantially coplanar with each other and higher than bottom surfaces of the second die and the second dielectric layer.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC devices, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
a first die;
a plurality of second dies disposed over and electrically connected to the first die; and
a through via, disposed between the second dies and electrically connected to the first die, the through via comprising a first portion having a first width and a second portion having a second width different from the first width and disposed between the first portion and the first die, wherein the first portion comprises a first seed layer and a first conductive layer, the first seed layer is disposed aside an interface between the first portion and the second portion.

2. The semiconductor package of claim 1, wherein the second portion comprises a second seed layer and a second conductive layer, and the first seed layer is physically separated from the second seed layer.

3. The semiconductor package of claim 1, wherein the second portion comprises a second seed layer and a second conductive layer, and the first seed layer is integrally formed with the second seed layer.

4. The semiconductor package of claim 1, further comprising an encapsulant and a dielectric layer different from the encapsulant, wherein the encapsulant encapsulates the second dies and the through via, and the dielectric layer is disposed between the encapsulant and the through via.

5. The semiconductor package of claim 4, wherein the encapsulant is disposed between the second dies and the dielectric layer and between the second dies and the first portion.

6. The semiconductor package of claim 4, wherein a bottom surface of the dielectric layer is substantially levelled with an interface between the first portion and the second portion.

7. A semiconductor package, comprising:
a first die;
a second die disposed over and electrically connected to the first die;
a plurality of first vias and a plurality of second vias alternately disposed aside the second die, wherein the first vias are electrically isolated from the second vias; and
an encapsulant, encapsulating the second die, the first vias and the second vias.

8. The semiconductor package of claim 7, wherein the first vias and the second vias have top surfaces substantially coplanar with a top surface of the encapsulant and the second die.

9. The semiconductor package of claim 7, further comprising a through via disposed in the encapsulant between the second die and the first vias and the second vias.

10. The semiconductor package of claim 9, wherein the through via comprises a first portion having a first width and a second portion having a second width different from the first width, and the first vias and the second vias have bottom surfaces substantially coplanar with an interface between the first portion and the second portion of the through via.

11. The semiconductor package of claim 7, wherein the first vias are electrically connected to each other, and the second vias are electrically connected to each other.

12. The semiconductor package of claim 7, wherein the first vias are physically connected to form a first comb-shaped structure, and the second vias are physically connected to form a second comb-shaped structure.

13. A semiconductor package, comprising:
a first die;
a second die disposed over and electrically connected to the first die;
a first via aside the second die, electrically connected to the first die;
a first dielectric layer, encapsulating the first via; and
a second dielectric layer different from the first dielectric layer, encapsulating the second die and the first dielectric layer, wherein bottom surfaces of the first via and the first dielectric layer are substantially coplanar with each other and higher than bottom surfaces of the second die and the second dielectric layer.

14. The semiconductor package of claim 13, wherein top surfaces of the first via and the first dielectric layer are substantially coplanar with top surfaces of the second die and the second dielectric layer.

15. The semiconductor package of claim 13, further comprising a second via disposed between the first via and the first die and physically connected to the first via, wherein a width of the second via is larger than a width of the firs via.

16. The semiconductor package of claim 15, wherein a distance between a sidewall of the first dielectric layer is smaller than a distance between a sidewall of the second via.

17. The semiconductor package of claim 13, further comprising a second via disposed between the first via and the first die, wherein an interface is formed between the first via and the second via, and a width of the second via is smaller than a width of the firs via.

18. The semiconductor package of claim 13, wherein the first via comprises a first seed layer and a first conductive layer on the first seed layer, and a sidewall of the first seed layer is substantially flush with a sidewall of a first conductive layer.

19. The semiconductor package of claim 13, further comprising a second via aside the first via, wherein the second via is encapsulated by the first dielectric layer.

20. The semiconductor package of claim 13, wherein the first dielectric layer is in direct contact with the first via and the second dielectric layer.

\* \* \* \* \*